United States Patent
Uchiyama et al.

(10) Patent No.: US 9,543,491 B2
(45) Date of Patent: Jan. 10, 2017

(54) THERMAL POWER GENERATION PORTABLE DEVICE AND POWER GENERATION CONTROL METHOD FOR THERMAL POWER GENERATION PORTABLE DEVICE

(75) Inventors: Takeshi Uchiyama, Chiba (JP); Manabu Oumi, Chiba (JP); Yoko Shinohara, Chiba (JP); Fumio Kimura, Chiba (JP)

(73) Assignee: SEIKO INSTRUMENTS INC. (JP)

(*) Notice: Subject to any disclaimer, the term of this patent is extended or adjusted under 35 U.S.C. 154(b) by 483 days.

(21) Appl. No.: 14/343,677

(22) PCT Filed: May 16, 2012

(86) PCT No.: PCT/JP2012/062526
§ 371 (c)(1),
(2), (4) Date: Mar. 7, 2014

(87) PCT Pub. No.: WO2013/038751
PCT Pub. Date: Mar. 21, 2013

(65) Prior Publication Data
US 2014/0225473 A1    Aug. 14, 2014

(30) Foreign Application Priority Data
Sep. 12, 2011    (JP) .................. 2011-198304

(51) Int. Cl.
*G04C 10/00* (2006.01)
*G04G 19/00* (2006.01)
(Continued)

(52) U.S. Cl.
CPC ............... *H01L 35/02* (2013.01); *G04C 10/00* (2013.01); *H01L 35/30* (2013.01); *G04G 19/00* (2013.01)

(58) Field of Classification Search
CPC ......... G04C 10/00; G04G 19/00; H01L 35/00; H01L 35/02; H01L 35/30; H01L 35/32
See application file for complete search history.

(56) References Cited

U.S. PATENT DOCUMENTS 4,106,279 A * 8/1978 Martin ................... G04C 10/00
368/203
4,213,292 A * 7/1980 Dolezal .................. H01L 35/00
320/101
(Continued)

OTHER PUBLICATIONS

European Search Report mailed May 25, 2016 issued in Application No. EP 12 83 2596.
(Continued)

*Primary Examiner* — Vit W Miska
(74) *Attorney, Agent, or Firm* — Adams & Wilks

(57) ABSTRACT

A portable thermal power generation device generates power using heat produced by a living body. A thermal power generation member generates power on the basis of a temperature difference between a temperature at a heat source-side position and a temperature at a heat release destination-side position between the living body that is a heat source and a heat release destination of heat released from the portable thermal power generation device. A movable member is configured to change a thermal resistance of at least part of a heat transfer path between the living body and the heat release destination.

20 Claims, 18 Drawing Sheets

(51) Int. Cl.
*H01L 35/02* (2006.01)
*H01L 35/30* (2006.01)

(56) References Cited

U.S. PATENT DOCUMENTS

| | | | |
|---|---|---|---|
| 6,100,671 A | 8/2000 | Kanesaka | 320/150 |
| 6,304,521 B1 | 10/2001 | Kanesaka | 368/204 |
| 6,359,841 B1 * | 3/2002 | Kotanagi | G04C 10/00 |
| | | | 136/205 |
| 6,426,921 B1 * | 7/2002 | Mitamura | G04C 10/00 |
| | | | 136/205 |
| 6,560,167 B1 * | 5/2003 | Kotanagi | H01L 35/32 |
| | | | 136/205 |

OTHER PUBLICATIONS

International Search Report mailed Aug. 7, 2012 issued in International Appln. No. PCT/JP2012/062526.
Patent Abstracts of Japan, Publication No. 11-287876, Publication Date Oct. 19, 1999.
Patent Abstracts of Japan, Publication No. 08-036071, Publication Date Feb. 6, 1996.

* cited by examiner

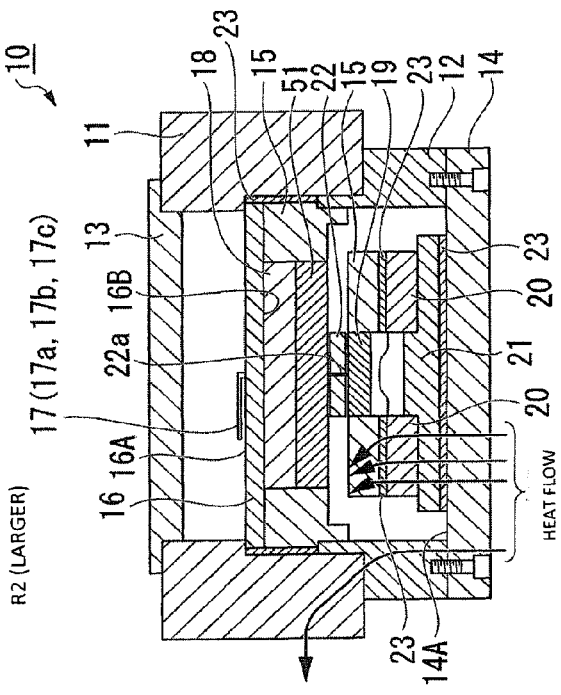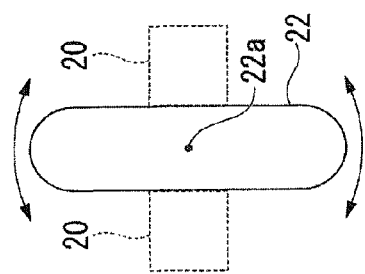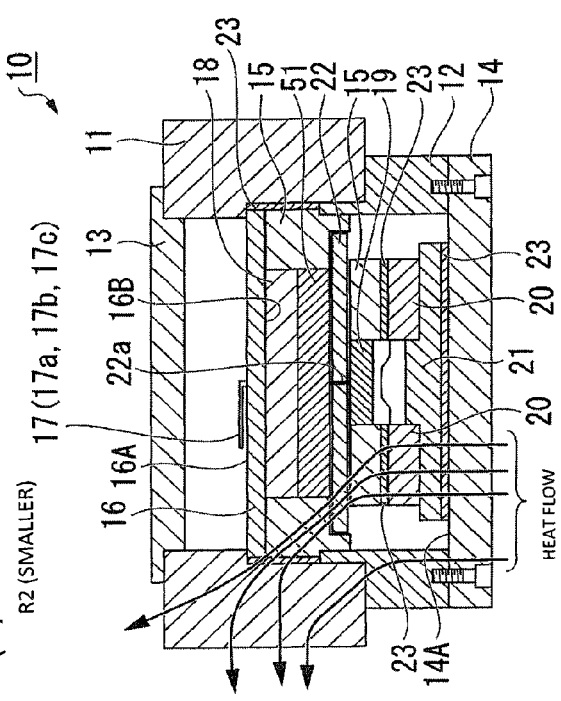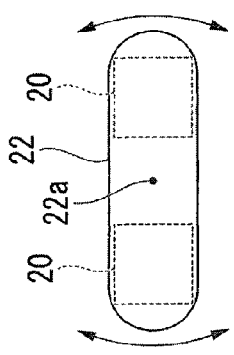
FIG. 11(A)
FIG. 11(B)

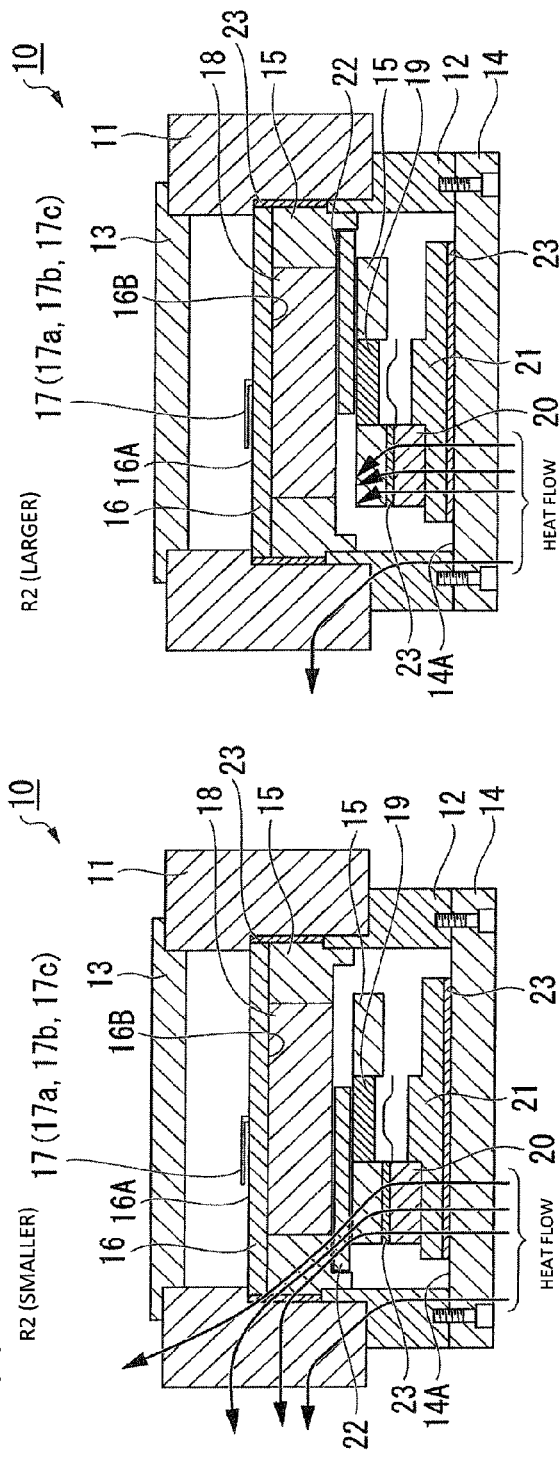
FIG. 13(A)
FIG. 13(B)

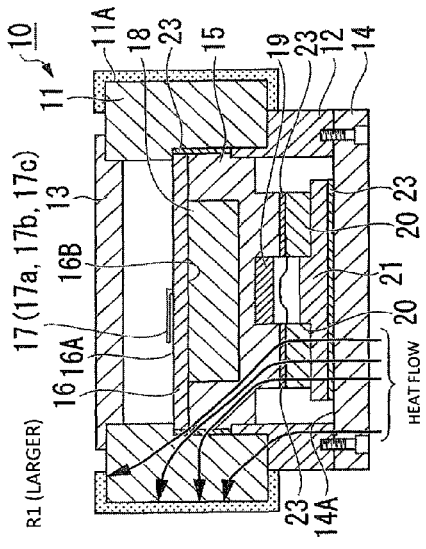
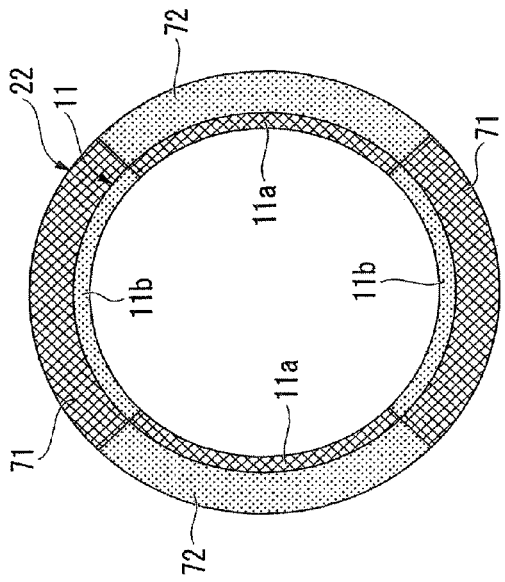
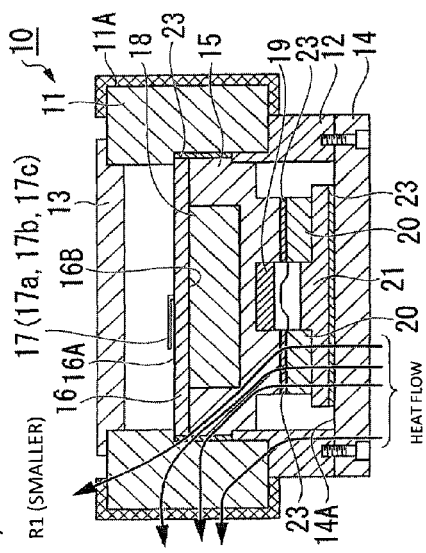
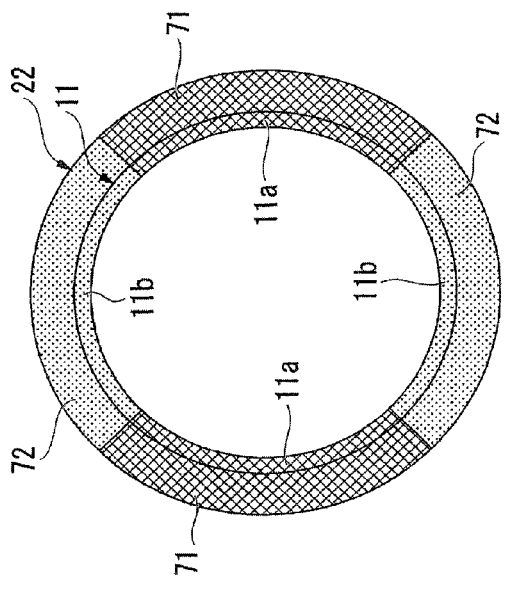
FIG. 20(A)
FIG. 20(B)

THERMAL POWER GENERATION PORTABLE DEVICE AND POWER GENERATION CONTROL METHOD FOR THERMAL POWER GENERATION PORTABLE DEVICE

BACKGROUND OF THE INVENTION

Technical Field

The present invention relates to a thermal power generation portable device and a power generation control method for the thermal power generation portable device.

In the related art, for example, there is known a thermal power generation wrist watch (for example, refer to PTL 1) in which a thermal power generating element is installed between a rear lid and a heat release ring inside a main body, and a power generation voltage is obtained due to a temperature difference between a temperature on a heat generation side to which body temperature is transferred via the rear lid from an arm of a human body and a temperature on a heat release side.

CITATION LIST

Patent Literature

[PTL 1] Japanese Patent No. 3054933

Incidentally, in the thermal power generation wrist watch related to the above related art, as the temperature of the overall thermal power generation wrist watch changes toward a thermal equilibrium state so as to saturate after the wrist watch is mounted to the arm of the human body, the temperature difference between the temperature on the heat generation side and the temperature on the heat release side of the thermal power generating element becomes small. As a result, since the power generation voltage of the thermal power generating element drops, there is a possibility that a desired power generation capacity cannot be ensured and power generation efficiency may be reduced.

SUMMARY OF THE INVENTION

The invention has been made in view of the above situations, and an object thereof is to provide a thermal power generation portable device and a power generation control method for the thermal power generation portable device capable of suppressing a reduction in power generation efficiency in a mounted state to a living body to thereby ensure a desired power generation capacity.

Solution to Problem

In order to solve the above problems and achieve the object, according to a first aspect of the invention, there is provided a thermal power generation portable device (for example, thermal power generation portable device 10 in an embodiment) that is mounted to a living body and is capable of generating power with the heat of the living body. The thermal power generation portable device includes a thermal power generating member (for example, a thermal power generating member 20 in the embodiment) that generates power on the basis of temperature difference between a temperature at a heat-source-side position and a temperature at a heat release destination-side position between the living body that is a heat source and a heat release destination of heat released from the thermal power generation portable device; and thermal resistance changing means (for example, a movable member 22, a member drive unit 51, a manual operation member 61 in the embodiment) capable of changing the thermal resistance of at least a portion of the heat transfer path between the living body and the heat release destination.

Moreover, in the thermal power generation portable device according to the first aspect of the invention, the thermal resistance changing means is capable of switching a state where the thermal resistance (for example, respective thermal resistances R1, R2, R3, and R5 in the embodiment) of at least a portion of the heat transfer path becomes a first thermal resistance and a state where the thermal resistance of at least a portion of the heat transfer path becomes a second thermal resistance different from the first thermal resistance.

Moreover, in the thermal power generation portable device according to the first aspect of the invention, the thermal resistance changing means has a movable member (for example, the movable member 22 in the embodiment) that is rotatable around a rotating shaft (for example, a rotating shaft 22a in the embodiment) or is slidingly movable in a predetermined direction and that is capable of changing the thermal resistance of at least a portion of the heat transfer path as the presence or absence of interference with the heat transfer path or a change in the position of interference with the heat transfer path with the rotation or the sliding movement.

Moreover, in the thermal power generation portable device according to the first aspect of the invention, the movable member is a plate-shaped member, and the plate-shaped member is capable of intersecting the heat transfer path.

Moreover, in the thermal power generation portable device according to the first aspect of the invention, the movable member that is rotatable around the rotating shaft has a shape point-symmetrical with respect to an axial center of the rotating shaft.

Moreover, in the thermal power generation portable device according to the first aspect of the invention, the movable member that is rotatable around the rotating shaft has a shape non-point-symmetrical with respect to an axial center of the rotating shaft.

Moreover, the thermal power generation portable device according to the first aspect of the invention includes at least any one of clocking means (for example, a control unit 31 in the embodiment) for counting time, voltage detecting means (for example, a voltage sensor 52 in the embodiment) for detecting the power generation voltage of the thermal power generating member, power storage means (for example, a power storage unit 34 in the embodiment) for storing the generated power of the thermal power generating member, and a power storage amount detecting means (for example, a power storage amount sensor 53 in the embodiment) that detects the power storage amount of the power storage means, and the thermal resistance changing means includes member drive means (for example, a member drive unit 51 in the embodiment) for automatically driving the movable member according to at least any one of a clocking operation of the clocking means, a detection result of the voltage detecting means, and a detection result of the power storage amount detecting means.

Moreover, in the thermal power generation portable device according to the first aspect of the invention, the clocking means includes hand drive means (for example, a hand drive unit 32 in the embodiment) for driving at least any one of a second hand (for example, a second hand 17a in the embodiment) indicating seconds of time, a minute hand (for example, a minute hand 17b in the embodiment) indicating minutes of time, and a hour hand (for example, a hour hand 17c in the embodiment) indicating hours of time, and the member drive means for automatically driving the movable member according to at least a measurement operation of the clocking means automatically drives the movable member in interlocking with at least any one of the second hand, the minute hand, and the hour hand that are driven by the hand drive means.

Moreover, in the thermal power generation portable device according to the first aspect of the invention, the thermal resistance changing means includes a manual operation member (for example, a manual operation member 61 in the embodiment) capable of manually operating the movable member.

Moreover, in the thermal power generation portable device according to the first aspect of the invention, the thermal resistance changing means is capable of changing the thermal resistance (for example, respective thermal resistances R1, R2, and R5 in the embodiment) of at least anyone out of between the living body and the thermal power generating member in the heat transfer path and between the heat release destination and the thermal power generating member in the heat transfer path.

Moreover, in the thermal power generation portable device according to the first aspect of the invention, the thermal resistance changing means capable of changing the thermal resistance between the living body and the thermal power generating member in the heat transfer path is capable of changing the thermal resistance (for example, the thermal resistance R5 in the embodiment) of a member (for example, a rear lid 14 in the embodiment) that comes into contact with the living body.

Moreover, in the thermal power generation portable device according to the first aspect of the invention, the thermal resistance changing means capable of changing the thermal resistance between the heat release destination and the thermal power generating member in the heat transfer path is capable of changing the thermal resistance (for example, the thermal resistance R2 in the embodiment) of a member (for example, a holding member 15 in the embodiment) that is provided between the heat release destination and the thermal power generating member in the heat transfer path and comes into contact with the thermal power generating member.

Moreover, in the thermal power generation portable device according to the first aspect of the invention, the thermal resistance changing means capable of changing the thermal resistance between the heat release destination and the thermal power generating member in the heat transfer path is capable of changing the thermal resistance (for example, the thermal resistance R1 in the embodiment) of a heat release region (for example, a heat release portion in the embodiment) between a housing (for example, a housing 11 in the embodiment) provided between the heat release destination and the thermal power generating member in the heat transfer path, and the heat release destination.

Additionally, according to a second aspect of the invention, there is provided a power generation control method for the thermal power generation portable device described according to the first aspect of the invention, the method comprising changing the thermal resistance of at least a portion of the heat transfer path during generation of power by the thermal power generating member, and after the change, changing the thermal resistance of at least a portion of the heat transfer path toward a value before the change.

According to the thermal power generation portable device according to the first aspect of the invention, the thermal power generating member made of, for example, a Peltier device or the like outputs the power generation voltage according to the magnitude of the temperature difference caused between the heat-source-side position and the heat release destination-side position of the thermal power generating member due to the temperature difference between the temperature (body temperature) of the living body that is a heat source and the temperature of the heat release destination, such as an atmosphere outside the thermal power generation portable device.

For this reason, the power generation voltage is increased by changing the thermal resistance of at least a portion of the heat transfer path with respect predetermined temperature difference between the heat source and the heat release destination such that the temperature difference increases locally between the heat-source-side position and the heat release destination-side position of the thermal power generating member in the heat transfer path. Accordingly, a desired power generation capacity can be ensured, and a reduction in power generation efficiency can be suppressed.

For example, first, in an initial state where the thermal power generation portable device is mounted to the living body that is a heat source, the thermal resistances of respective in-line regions (for example, respective regions constituted by members that constitute a main body of the device, the air inside the device, or the like) that constitute the heat transfer path are set to be equal to each other or set to values smaller than the thermal resistance of the thermal power generating member. Accordingly, the temperature difference between the heat-source-side position and the heat release destination-side position of the thermal power generating member can be rapidly increased to a temperature difference in a maximum power generation state according to the predetermined temperature difference between the heat source and the heat release destination, and power generation efficiency can be increased.

Also, after the temperature difference between the heat-source-side position and the heat release destination-side position of the thermal power generating member and the power generation voltage of the thermal power generating member are reduced as the temperature of the whole thermal power generation portable device changes toward thermal equilibrium state so as to saturate, the thermal resistance of at least a portion of the heat transfer path is changed, for example, by increasing the thermal resistance of an appropriate region having a serial connection relationship with respect to the thermal power generating member in the heat transfer path between the heat source and the heat release destination.

As a result, for example, a thermal equilibrium state where the predetermined temperature difference between the heat source and the heat release destination is distributed over the whole heat transfer path is changed, and a thermal equilibrium state where this predetermined temperature difference is locally concentrated on a portion of the heat transfer path is formed.

Also, after a local temperature difference is formed in a portion of the heat transfer path on the basis of the predetermined temperature difference between the heat source and the heat release destination, the thermal resistance of the heat transfer path is changed to a state before the change (for example, a state where the thermal resistances of the respective in-line regions that constitute the heat transfer path are equal to each other or are smaller than the thermal resistance of the thermal power generating member), or the like.

As a result, in a thermal transient state, the temperature difference between the heat-source-side position and the heat release destination-side position of the thermal power generating member and the power generation voltage of the thermal power generating member can be increased again to the degree of the initial state (for example, the temperature difference, the power generation voltage, and the like in the maximum power generation state), a desired power generation capacity can be ensured, a reduction in power generation efficiency can be suppressed.

Moreover, according to the thermal power generation portable device according to the first aspect of the invention, a temperature difference with a desired magnitude based on the predetermined temperature difference between the heat source and the heat release destination can be ensured between the heat-source-side position and the heat release destination-side position of the thermal power generating member by switching the thermal resistance of at least a portion of the heat transfer path to the first thermal resistance and the second thermal resistance, thereby changing temperature distribution in the heat transfer path between the heat source and the heat release destination.

As a result, a desired power generation voltage and a desired power generation capacity can be ensured, and a reduction in power generation efficiency can be suppressed.

Moreover, according to the thermal power generation portable device according to the first aspect of the invention, the thermal resistance of at least a portion of the heat transfer path can be changed, for example, according to the presence or absence of interference with the heat transfer path by the movable member having an appropriate thermal resistance or for example, according to a change in the position of interference with the heat transfer path by the movable member having different thermal resistances according to positions.

As a result, simply by including the movable member that is rotatable around the rotating shaft or slidingly movable in a predetermined direction, the thermal resistance of at least a portion of the heat transfer path can be easily changed while suppressing that the configuration of the device becomes complicated.

Moreover, according to the thermal power generation portable device according to the first aspect of the invention, the thermal resistance of at least a portion of the heat transfer path can be changed, for example, according to the presence or absence of an intersection state with the heat transfer path by the plate-shaped member having an appropriate thermal resistance or for example, according to a change in the intersecting position with the heat transfer path by the plate-shaped member having different thermal resistances according to positions.

As a result, simply by including the plate-shaped member that is rotatable around the rotating shaft or slidingly movable in a predetermined direction, the thermal resistance of at least a portion of the heat transfer path can be easily changed while suppressing that the configuration of the device becomes complicated.

Moreover, according to the thermal power generation portable device according to the first aspect of the invention, the rotational property of the movable member can be improved, the presence or absence of interference with the heat transfer path accompanying rotation or a change in the position of interference with the heat transfer path accompanying rotation can be easily induced, and the thermal resistance of at least a portion of the heat transfer path can be easily changed.

Moreover, according to the thermal power generation portable device according to the first aspect of the invention, the rotational property of the movable member caused by the action of gravity can be improved, the presence or absence of interference with the heat transfer path accompanying rotation or a change in the position of interference with the heat transfer path accompanying rotation can be easily induced, and the thermal resistance of at least a portion of the heat transfer path can be easily changed.

Moreover, according to the thermal power generation portable device according to the first aspect of the invention, a desired power generation voltage and a desired power generation capacity can be easily ensured and a reduction in power generation efficiency can be suppressed by automatically changing the thermal resistance of at least a portion of the heat transfer path, for example, according to a predetermined period or time, for example, according to a drop in power generation voltage, or for example, according to a reduction in power storage amount.

Moreover, according to the thermal power generation portable device according to the first aspect of the invention, by virtue of the interlocking operation with the hand drive means and the member drive means, a desired power generation voltage and a desired power generation capacity can be ensured while suppressing that the configuration of the device becomes complicated, and a reduction in power generation efficiency can be suppressed.

Moreover, according to the thermal power generation portable device according to the first aspect of the invention, a desired power generation voltage and a desired power generation capacity can be ensured according to an operator's intention, and a reduction in power generation efficiency can be suppressed.

Moreover, according to the thermal power generation portable device according to the first aspect of the invention, even in a case where the temperature difference between the heat-source-side position and the heat release destination-side position of the thermal power generating member is reduced in a state where the thermal power generation portable device is mounted to the living body, the temperature difference between the heat-source-side position and the heat release destination-side position of the thermal power generating member can be increased again by temporarily increasing and then reducing at least the thermal resistance between the living body and the thermal power generating member in the heat transfer path or between the heat release destination and the thermal power generating member.

As a result, a desired power generation voltage and a desired power generation capacity can be ensured, and a reduction in power generation efficiency can be suppressed.

Additionally, according to the power generation control method for a thermal power generation portable device according to second aspect of the invention, even in a case where the temperature difference between the heat-source-side position and the heat release destination-side position of the thermal power generating member and the power generation voltage of a thermal power generating member are reduced as the temperature of the overall thermal power generation portable device mounted to the living body changes toward the thermal equilibrium state so as to saturate, the temperature difference between the heat-source-side position and the heat release destination-side position of the thermal power generating member can be increased again.

As a result, a desired power generation voltage and a desired power generation capacity can be ensured, and reduction in power generation efficiency can be suppressed.

BRIEF DESCRIPTION OF DRAWINGS

FIG. 11 is a view showing the state of the movable member in the state where the thermal resistance of the region including the housing and the holding member becomes the first thermal resistance with a smaller value and the state where the thermal resistance of the region becomes the second thermal resistance with a larger value, in the thermal power generation portable device related to a third modification example of the embodiment of the invention.

FIG. 13 is a view showing the state of the movable member in the state where the thermal resistance of the region including the housing and the holding member becomes the first thermal resistance with a smaller value and the state where the thermal resistance of the region becomes the second thermal resistance with a larger value, in the thermal power generation portable device related to a fourth modification example of the embodiment of the invention.

FIG. 20 is a view showing the state of the movable member in a state where the thermal resistance of a heat release portion including a surface of a thermal power generation portable device and a region near the surface becomes the first thermal resistance with a smaller value and a state where the thermal resistance of the heat release portion including a surface of a thermal power generation portable device and a region near the surface becomes the second thermal resistance with a larger value, in the thermal power generation portable device related to a ninth modification example of the embodiment of the invention.

DETAILED DESCRIPTION OF THE EMBODIMENTS

Hereinafter, a thermal power generation portable device and a power generation control method for the thermal power generation portable device related to one embodiment of the invention will be described referring to the accompanying drawings.

Figure 1:
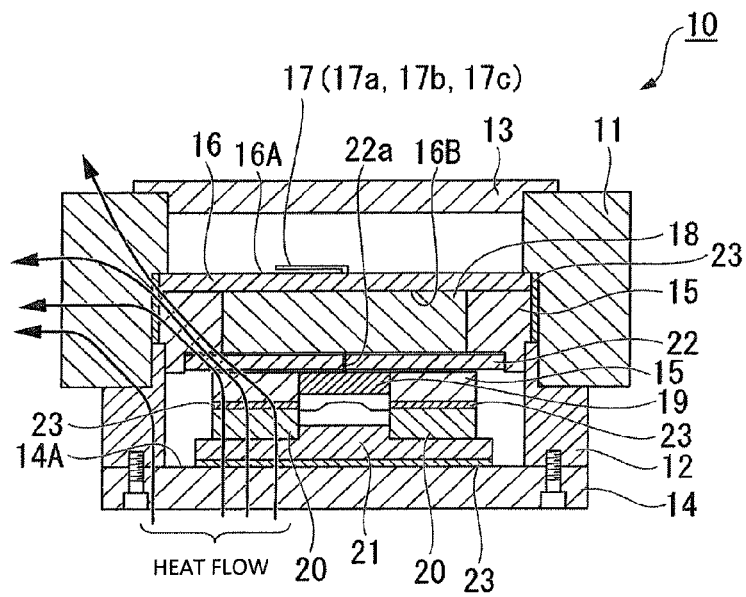
FIG. 1 is a cross-sectional view of a thermal power generation portable device related to an embodiment of the invention.

A thermal power generation portable device 10 according to the present embodiment is, for example, a wrist watch mounted to an arm of a human body, and as shown in FIG. 1, is configured to include a housing 11, a frame body 12, a cover glass 13, a rear lid 14, a holding member 15, a dial plate 16, a pointer unit 17, a movement 18, a substrate 19, a thermal power generating member 20, a heat-conducting member 21, and a movable member 22.

The housing 11 is formed in a tubular shape from, for example, metal or the like, has one opening end blocked by the cover glass 13, and has the other opening end connected to one opening end of the tubular frame body 12.

The frame body 12 is formed in a tubular shape from, for example, synthetic resin or the like, and has the other opening end blocked by the rear lid 14.

The holding member 15 is formed from, for example, metals, such as aluminum, copper, and brass, and is housed inside the housing 11 and the frame body 12.

The dial plate 16 has a rear surface 16B held by the movement 18 so that a front surface 16A on which marks, such as figures related to seconds, minutes, and hours of time, are provided can be visually recognized from the outside via the cover glass 13.

The pointer unit 17 is configured to include, for example, a second hand 17a indicating seconds of time, a minute hand 17b indicating minutes of time, and a hour hand 17c indicating hours of time, is provided so as to protrude from the front surface 16A of the dial plate 16, and is rotationally driven by the movement 18 to point appropriate marks related to time, which are provided on the front surface 16A of the dial plate 16.

The movement 18, for example, is arranged on the rear surface 16B side of the dial plate 16 and held by the holding member 15.

Figure 2:
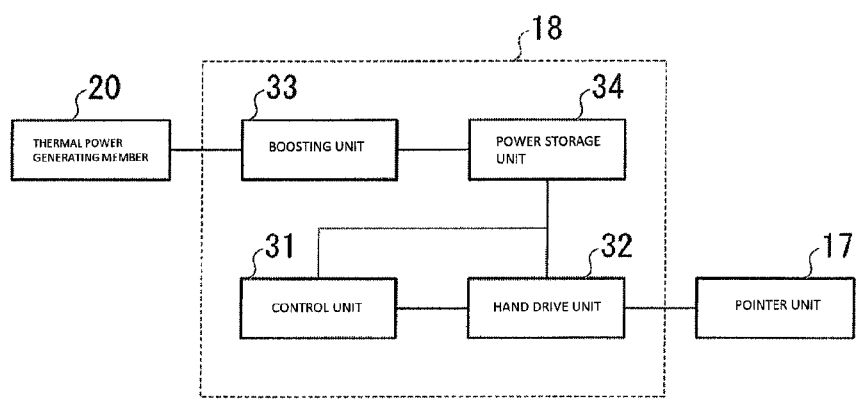
FIG. 2 is a configuration view of a movement of the thermal power generation portable device related to the embodiment of the invention.

The movement 18, for example as shown in FIG. 2, is configured to include a control unit 31, a hand drive unit 32, a boosting unit 33, and a power storage unit 34.

The control unit 31 includes, for example, an oscillating circuit, a frequency-dividing circuit, a motor driving-pulse output circuit, or the like that operates with electric power supplied from the power storage unit 34, and outputs a driving pulse for driving the hand drive unit 32 from the motor driving-pulse output circuit, according to a signal serving as a reference for timing output from the frequency-dividing circuit.

The hand drive unit 32 includes, for example, a stepping motor or the like, and rotationally drives the second hand 17a, the minute hand 17b, and the hour hand 17c of the pointer unit 17 according to the driving pulse output from the control unit 31.

The boosting unit 33 includes, for example, an oscillating circuit, a charge pump circuit, or the like, is connected to the thermal power generating member 20, and boosts a power generation voltage output from the thermal power generating member 20 to output a boosted voltage.

The power storage unit 34 includes, for example, secondary battery, a capacitor, or the like, is connected to the boosting unit 33, and stores electric power output from the boosting unit 33.

The substrate 19 is held by, for example, the holding member 15.

The thermal power generating member 20 is made of, for example, a Peltier device, a thermocouple, or the like, and is held so as to be sandwiched by the holding member 15 and the heat-conducting member 21.

The heat-conducting member 21 is formed in a plate shape from, for example, copper or the like, and is arranged on an inner surface 14A side of the rear lid 14.

Figure 3A:
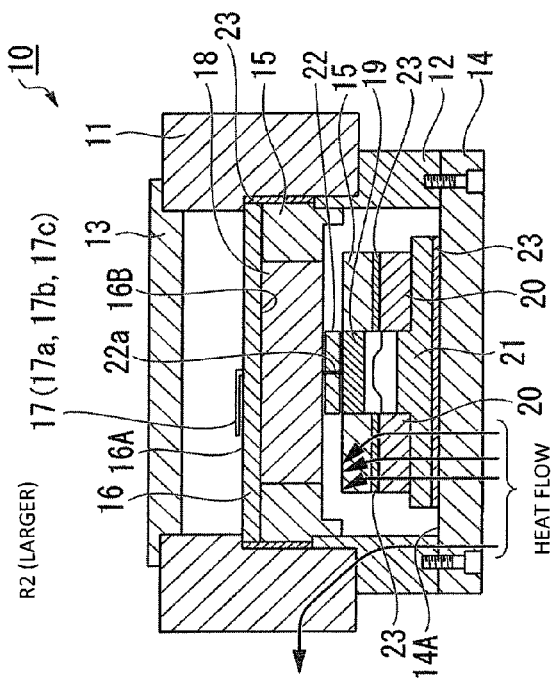
FIG. 3 is a view showing the state of a movable member in a state where the thermal resistance of a region including a housing and a holding member becomes a first thermal resistance with a smaller value and a state where the thermal resistance of the region becomes a second thermal resistance with a larger value, in the thermal power generation portable device related to the embodiment of the invention.
Figure 3A:
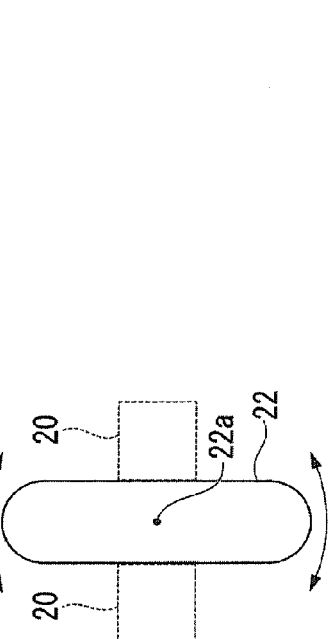
Figure 3B:
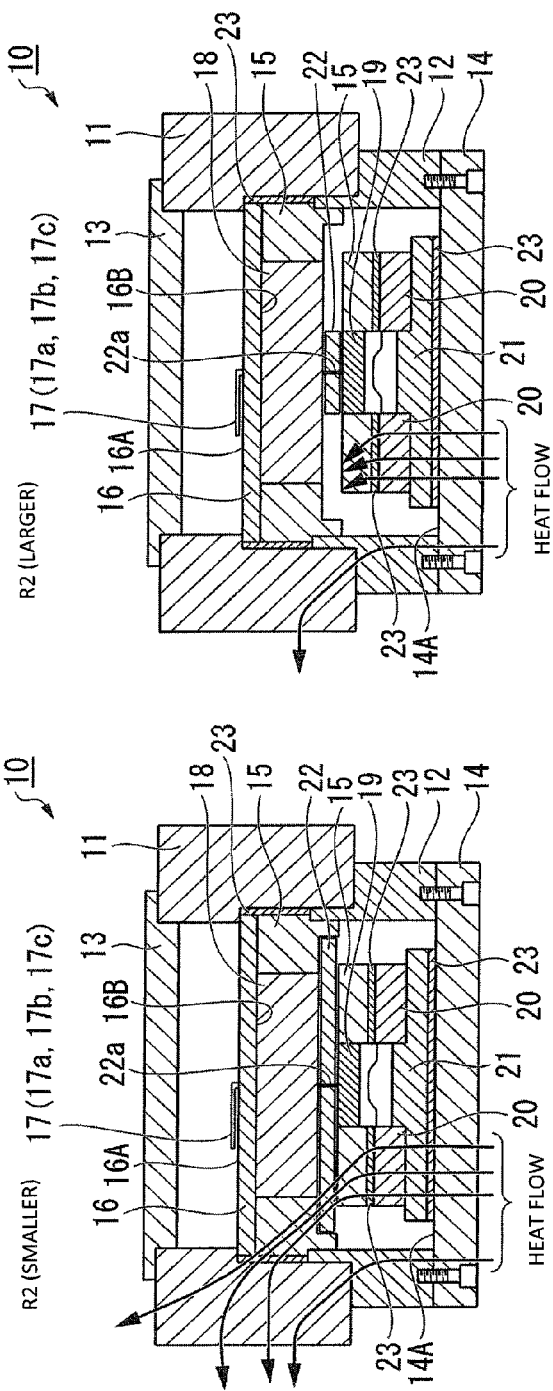
Figure 3B:

The movable member 22, for example as shown in FIGS. 3(A) and 3(B), is formed in the shape of an elliptical plate or a lengthy plate from metal or the like, has a shape point-symmetrical with respect to the axial center of a rotating shaft 22a, is housed inside the holding member 15, and is supported so as to be rotatable around the rotating shaft 22a.

As a result, the movable member 22 rotates according to, for example, an external force applied to the thermal power generation portable device 10 from the outside.

Also, the movable member 22, for example, is formed so as to have thermal resistance (for example, thermal resistance smaller than that in air) different from the thermal resistance of an atmosphere (air or the like) inside the holding member 15 in which the movable member 22 is housed.

Moreover, the movable member 22, for example, is formed so as to have, for example as shown in FIG. 3(A), a shape capable of being superimposed so as to cover two thermal power generating members 20 and 20 in the direction of a long side and so as to have, for example as shown in FIG. 3(B), a shape (that is, a shape of which the length in the direction of a short side is shorter than the interval between the two thermal power generating members 20 and 20) of being not superimposed on the two thermal power generating members 20 and 20 such that the movable member fits between the two thermal power generating members 20 and 20 in the direction of the short side, when the two thermal power generating members 20 and 20 arranged at positions point-symmetrical with respect to the axial center of the rotating shaft 22a are viewed from a direction that faces the rear lid 14 from the cover glass 13.

As a result, for example, switching to a case where a flow of heat sequentially transferred to the rear lid 14, the heat-conducting member 21, the thermal power generating member 20, the holding member 15, and the housing 11 goes through the movable member 22 as shown in FIG. 3(A), and a case where the heat flow goes through the inside of the atmosphere (air or the like) inside the holding member 15 without going through the movable member 22 as shown in FIG. 3(B) is made according to the rotation of the movable member 22.

Figure 4:
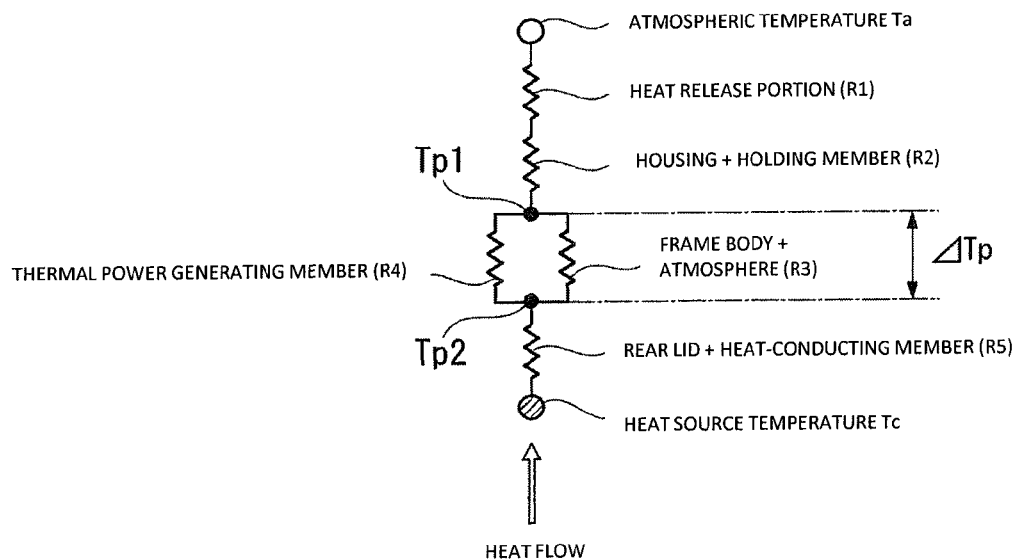
FIG. 4 is a view showing a thermal resistance model of the thermal power generation portable device related to the embodiment of the invention.

Here, if a thermal resistance model as shown in FIG. 4, for example, is applied to the thermal power generation portable device 10 of the above configuration, the thermal resistance of the movable member 22 made of metal is smaller than the thermal resistance of the atmosphere (air or the like) inside the holding member 15. Thus, a thermal resistance R2 of a region including the housing 11 and the holding member 15 changes according to the rotation of the movable member 22.

That is, when the movable member 22 interferes (that is, intersects) with a heat transfer path for the flow of heat sequentially transferred to the rear lid 14, the heat-conducting member 21, the thermal power generating member 20, the holding member 15, and the housing 11 as shown in FIG. 3(A), the thermal resistance R2 of the region including the housing 11 and the holding member 15 becomes a first thermal resistance R2a with a smaller value, and when the movable member 22 does not interfere (that is, does not intersect) with the heat transfer path as shown in FIG. 3(B), the thermal resistance R2 becomes a second thermal resistance R2b (>first thermal resistance R2a) with a larger value.

In addition, for example, in the thermal resistance model shown in FIG. 4, with respect to a thermal resistance R5 of a region including the rear lid 14 and the heat-conducting member 21, the thermal resistance R4 of the thermal power generating member 20, the thermal resistance R3 of a region including the frame body 12 and an atmosphere inside the frame body 12, the thermal resistance R2 of the region including the housing 11 and the holding member 15, and the thermal resistance R1 of a heat release portion including the front surface (for example, a front surface 11A of the housing 11, or the like) of the thermal power generation portable device 10 and a region near the front surface, the respective thermal resistances R1, R2, R3, and R5 are connected in series between a living body that is a heat source that comes into contact with the rear lid 14 and a heat release destination, such as an atmosphere outside the thermal power generation portable device 10, and the thermal resistance R4 is connected in parallel to the thermal resistance R3 between the thermal resistances R2 and R5.

Also, the thermal power generating member 20 outputs a power generation voltage according to the magnitude of temperature difference $\Delta Tp$ ($=Tp2-Tp1$) caused between a temperature $Tp2$ at a heat-source-side position and temperature $Tp1$ at a heat release destination-side position of the thermal power generating member 20 due to a temperature difference between the temperature (heat source temperature $Tc$) of the living body that is a heat source and the temperature (atmospheric temperature $Ta$) of the heat release destination, such as the atmosphere outside the thermal power generation portable device 10.

In addition, the thermal power generation portable device 10, for example, is configured so that the respective thermal resistances R1 and R5 and the thermal resistance R2 showing the first thermal resistance become equal to the thermal resistance R4 of the thermal power generating member 20 or smaller than the thermal resistance R4 of the thermal power generating member 20. Additionally, the thermal resistance R3, for example, is configured so as to become larger than the respective thermal resistances R1, R2, R4, and R5.

In addition, thermally conductive grease 23 is coated, for example, between the heat-conducting member 21 and the rear lid 14, between the holding member 15 and the thermal power generating member 20, and between the housing 11 and the holding member 15.

The thermal power generation portable device 10 according to the present embodiment includes the above configuration, and next, the operation of this thermal power generation portable device 10 will be described.

Figure 5:
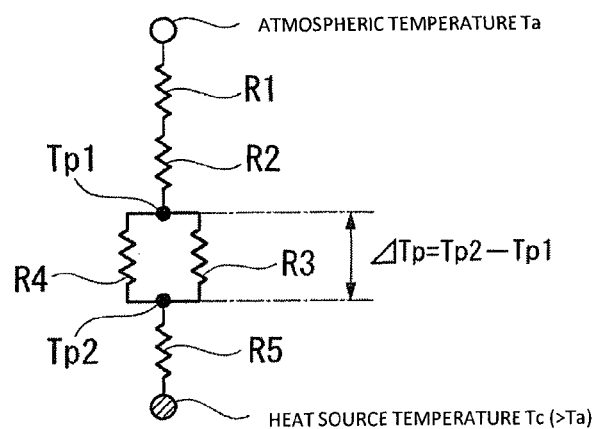
FIG. 5 is a view showing an example of temperature distribution in the thermal resistance model in a state where the thermal power generation portable device related to the embodiment of the invention is mounted to a living body.

First, for example as shown in FIG. 5, with respect to the living body that is a heat source that has a higher temperature (heat source temperature) $Tc$ than the temperature (atmospheric temperature) $Ta$ of the atmosphere outside the thermal power generation portable device 10, if the thermal power generation portable device 10 is mounted to the living body and the rear lid 14 comes into contact with the living body, a heat flow is transferred from the heat source via the region including the rear lid 14 and the heat-conducting member 21 to the heat-source-side position of the thermal power generating member 20.

Figure 6:
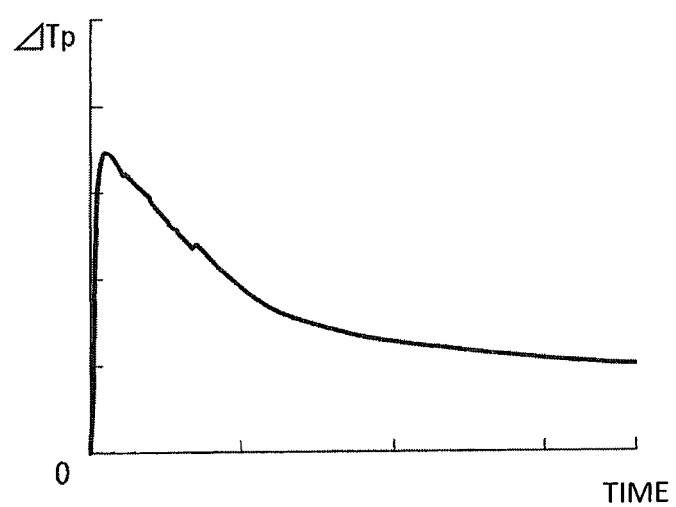
FIG. 6 is a graph chart showing an example of changes in a temperature difference $\Delta Tp$ caused between a temperature at a heat-source-side position and a temperature at a heat release destination-side position of a thermal power generating member after the thermal power generation portable device related to the embodiment of the invention is mounted to the living body.

In this thermal transient state, the temperature $Tp2$ at the heat-source-side position of the thermal power generating member 20 rises, and for example as shown in FIG. 6, the temperature difference $\Delta Tp$ ($=Tp2-Tp1$) caused between the temperature $Tp2$ at the heat-source-side position of the thermal power generating member 20 and the temperature $Tp1$ at the heat release destination-side position and the power generation voltage of the thermal power generating member 20 increases toward a maximum value.

In addition, the maximum value of the temperature difference $\Delta Tp$, for example, is described as shown in the following numerical expression (1) by the thermal resistance $R$ of the whole heat transfer path from the heat source to the heat release destination, the thermal resistance $R4$ of the thermal power generating member 20, the thermal resistance $R3$ of the region (that is, a region having a parallel connection relationship with respect to the thermal power generating member 20 in the thermal resistance model shown in FIG. 4) including the frame body 12 and the atmosphere inside the frame body 12, the atmospheric temperature $Ta$, and the heat source temperature $Tc$.

[Math. 1]

$$\Delta Tp = \frac{(Tc - Ta)\left(\frac{1}{\frac{1}{R3} + \frac{1}{R4}}\right)}{R} \qquad (1)$$

Also, as a heat flow is transferred via the region including the thermal power generating member 20, the frame body 12, and the atmosphere inside the frame body 12 to the heat release destination-side position and further heat release destination of the thermal power generating member 20, the temperature difference $\Delta Tp$ changes from the maximum value with a reduction tendency, a thermal equilibrium state where the temperature of the whole thermal power generation portable device 10 saturates, in other words, a thermal equilibrium state where the predetermined temperature difference ($Tc-Ta$) between the heat source and the heat release destination is distributed over the whole heat transfer path, a local temperature gradient becomes small is formed.

If such a thermal equilibrium state where the temperature of the whole thermal power generation portable device 10 saturates is maintained, a state where the temperature difference $\Delta Tp$ and the power generation voltage have reduced is maintained. However, if the thermal resistance (for example, thermal resistance R2) of at least a portion of the heat transfer path between the heat source and the heat release destination is changed according to the rotation of the movable member 22, the thermal transient state occurs again and the temperature difference $\Delta Tp$ and the power generation voltage increase.

Figures 7A, 7B, 7C:
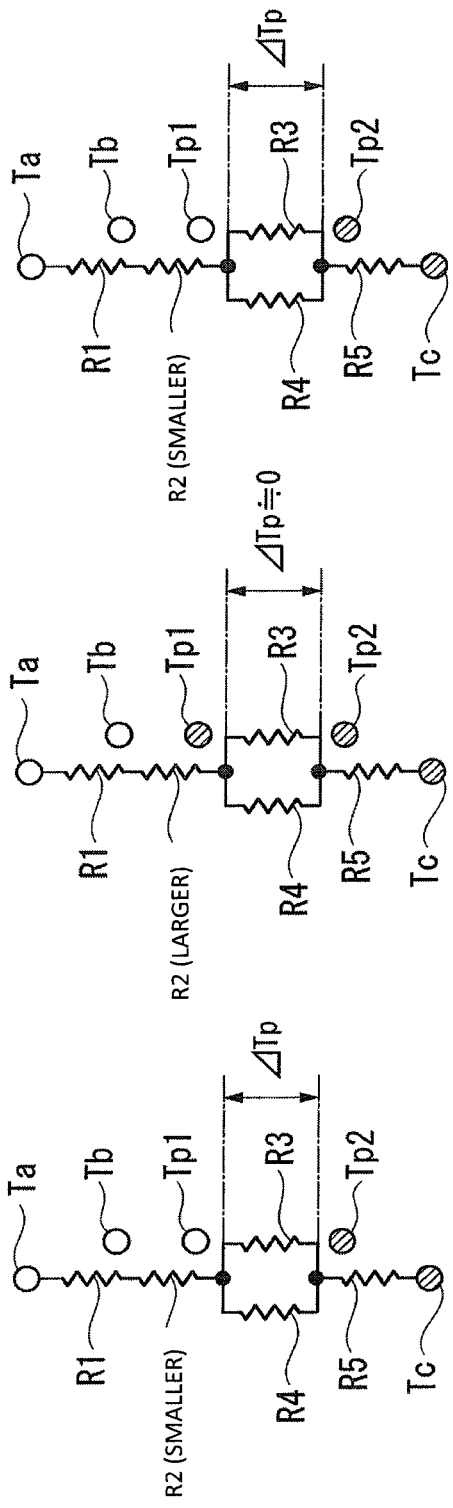
FIG. 7 is a view showing the thermal resistance of the region including the housing and the holding member which changes according to the state of a movable member and changes in temperature distribution in the thermal resistance model, after the thermal power generation portable device related to the embodiment of the invention is mounted to the living body.

For example, first, if the movable member 22 intersects the heat transfer path and thereby the thermal resistance R2 of the region including the housing 11 and the holding member 15 becomes the first thermal resistance R2a with a smaller value as shown in FIG. 3(A), in an initial state where the thermal power generation portable device 10 is mounted to the living body that is a heat source, a heat flow is transferred from the heat source via the region including the rear lid 14 and the heat-conducting member 21 to the heat-source-side position of the thermal power generating member 20 and the temperature Tp2 at the heat-source-side position rises, as shown in FIG. 7(A). On the other hand, the heat release destination-side position of the thermal power generating member 20 is cooled by the atmosphere outside the thermal power generation portable device 10 via the region including the heat release portion, the housing 11, and the holding member 15, and a rise in the temperature Tp1 at the heat release destination-side position is suppressed.

Figure 8:
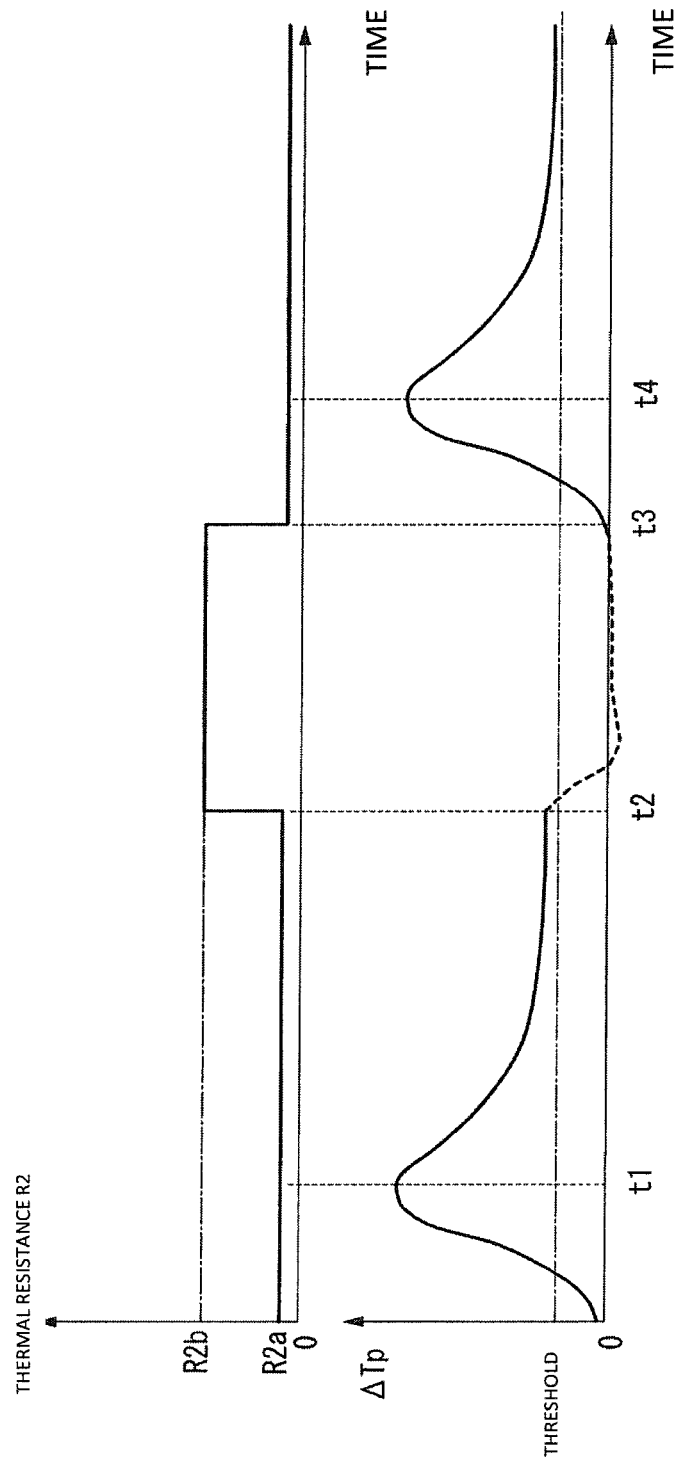
FIG. 8 is a view showing the thermal resistance of the region including the housing and the holding member which changes according to the state of the movable member and changes in the temperature difference $\Delta Tp$ caused between the temperature at the heat-source-side position and the temperature at the heat release destination-side position of the thermal power generating member, after the thermal power generation portable device related to the embodiment of the invention is mounted to the living body.

As a result, for example as in a period ranging to time t1 shown in FIG. 8, the temperature difference $\Delta$Tp (=Tp2 Tp1) caused between the temperature Tp2 at the heat-source-side position and the temperature Tp1 at the heat release destination-side position of the thermal power generating member 20 and the power generation voltage of the thermal power generating member 20 increase toward the maximum value.

Next, as the temperature of the whole thermal power generation portable device 10 changes toward the thermal equilibrium state so as to saturate, in other words, the predetermined temperature difference (Tc−Ta) between the heat source and the heat release destination is distributed over the whole heat transfer path, the local temperature gradient becomes small. As a result, for example as in a period ranging from the time t1 to time t2 shown in FIG. 8, the temperature difference $\Delta$Tp (=Tp2−Tp1) caused between the temperature Tp2 at the heat-source-side position and the temperature Tp1 at the heat release destination-side position of the thermal power generating member 20 and the power generation voltage of the thermal power generating member 20 change with reduction tendency.

Next, if the movable member 22 rotates around the rotating shaft 22a, and as shown in FIG. 3(B), the movable member 22 no longer intersects the heat transfer path and thereby the thermal resistance R2 of the region including the housing 11 and the holding member 15 changes to the second thermal resistance R2b with a larger value, a heat flow transferred from the heat source via the region including the rear lid 14 and the heat-conducting member 21 and the region including the thermal power generating member 20 or the frame body 12 and the atmosphere inside the frame body 12 to the heat release destination-side position of the thermal power generating member 20 is dammed in, for example, the region including the housing 11 and the holding member 15 as shown in FIG. 7(B).

As a result, for example as in a period from the time t2 to time t3 shown in FIG. 8, the temperature Tp1 at the heat release destination-side position of the thermal power generating member 20 rises so as to become equal to the temperature Tp2 at the heat-source-side position, and the temperature difference $\Delta$Tp and the power generation voltage of the thermal power generating member 20 change toward zero with a reduction tendency. On the other hand, the region including the housing 11 and the holding member 15 is easily cooled by the atmosphere outside the thermal power generation portable device 10, and the temperature Tb of the region including the housing 11 and the holding member 15 drops.

That is, the movable member 22 rotates around the rotating shaft 22a and thereby the temperature distribution in the heat transfer path between the heat source and the heat release destination is changed, and the temperature difference between the temperature Tp1 at the heat release destination-side position of the thermal power generating member 20 and the temperature Tb of the region including the housing 11 and the holding member 15 increases.

As a result, for example, the thermal equilibrium state where the predetermined temperature difference (Tc−Ta) between the heat source and the heat release destination is distributed over the whole heat transfer path is changed, and the thermal equilibrium state where this predetermined temperature difference (Tc−Ta) is locally concentrated on a portion (that is, the region including the housing 11 and the holding member 15) of the heat transfer path is formed.

Next, if the movable member 22 rotates around the rotating shaft 22a, and as shown in FIG. 3(A), the movable member 22 intersects the heat transfer path again and thereby the thermal resistance R2 of the region including the housing 11 and the holding member 15 changes to the first thermal resistance R2a with a smaller value, the heat release destination-side position of the thermal power generating member 20 is cooled by the atmosphere outside the thermal power generation portable device 10 via the region including the heat release portion, the housing 11, and the holding member 15, and the temperature Tp1 at the heat release destination-side position drops, as shown in FIG. 7(C).

As a result, for example as in a period from the time t3 to time t4 shown in FIG. 8, the temperature difference $\Delta$Tp (=Tp2−Tp1) caused between the temperature Tp2 at the heat-source-side position and the temperature Tp1 at the heat release destination-side position of the thermal power generating member 20 and the power generation voltage of the thermal power generating member 20 increase toward the maximum value, in the thermal transient state where the temperature Tp1 at the heat release destination-side position of the thermal power generating member 20 drops.

Also, for example as in a period after the time t4 shown in FIG. 8, as the temperature of the whole thermal power generation portable device 10 changes toward the thermal equilibrium state so as to saturate, in other words, the predetermined temperature difference (Tc−Ta) between the heat source and the heat release destination is distributed over the whole heat transfer path, the local temperature gradient becomes small after the temperature difference $\Delta$Tp (=Tp2−Tp1) and the power generation voltage of the thermal power generating member 20 have reached the maximum value. As a result, the temperature difference $\Delta$Tp (=Tp2−Tp1) caused between the temperature Tp2 at the heat-source-side position and the temperature Tp1 at the heat release destination-side position of the thermal power generating member 20 and the power generation voltage of the thermal power generating member 20 change with a reduction tendency.

As described above, according to the thermal power generation portable device 10 related to the present embodiment, the thermal resistance R2 of the region including the holding member 15 and the housing 11 in which the movable member 22 is housed is changed according to the rotation of the movable member 22 around the rotating shaft 22a. As a result, the temperature difference $\Delta$Tp (=Tp2−Tp1) can be locally increased between the heat-source-side position and the heat release destination-side position of the thermal power generating member 20 with respect to the predetermined temperature difference (Tc−Ta) between the heat source and the heat release destination, the power generation voltage can be increased to ensure a desired power generation capacity, and a reduction in power generation efficiency can be suppressed.

More specifically, the temperature distribution in the heat transfer path between the heat source and the heat release destination is changed as the thermal resistance R2 of the region including the holding member 15 and the housing 11 in which the movable member 22 is housed is switched to the first thermal resistance R2a and the second thermal resistance R2b. As a result, in the thermal transient state resulting from this, the temperature difference $\Delta Tp$ ($=Tp2-Tp1$) with a desired magnitude based on the predetermined temperature difference (Tc−Ta) between the heat source and the heat release destination can be ensured between the heat-source-side position and the heat release destination-side position of the thermal power generating member 20.

Moreover, simply by including the movable member 22 rotatable around the rotating shaft 22a, the presence or absence of interference (that is, intersection) of the movable member 22 with the heat transfer path can be easily switched, and the thermal resistance R2 of at least a portion (that is, the region including the holding member 15 and the housing 11) of the heat transfer path can be easily changed while suppressing that the configuration of the device becomes complicated.

Moreover, the movable member 22 is formed in the shape of an elliptical plate or a lengthy plate as the shape point-symmetrical with respect to the axial center of the rotating shaft 22a and the rotational property thereof is enhanced. Therefore, the presence or absence of interference (that is, intersection) with the heat transfer path accompanying the rotation can be easily induced, and the thermal resistance R2 of at least a portion (that is, the region including the holding member 15 and the housing 11) of the heat transfer path can be easily changed.

In addition, in the above-described embodiment, the movable member 22 is formed in the shape of an elliptical plate or a lengthy plate, and the presence or absence of interference (that is, intersection) with the heat transfer path changes according to the rotation of the movable member 22 around the rotating shaft 22a. However, the invention is not limited to this. For example, as in a first modification example shown in FIGS. 9(A) and 9(B), the movable member 22 may be formed in the shape of a disk with different thermal resistances according to positions so that the position and thermal resistance of interference (that is, intersection) with the heat transfer path change according to the rotation of the movable member 22 around the rotating shaft 22a.

The movable member 22 of the thermal power generation portable device 10 related to this first modification example is configured to include, for example, a first member 41 that is formed in the shape of an elliptical plate or a lengthy plate and has a first thermal resistance Ra from metal or the like, and a second member 42 that is formed in the shape of a disk from synthetic resin or the like, has a larger second thermal resistance Rb than the first thermal resistance Ra, and houses the first member 41 therein.

Figure 9A:
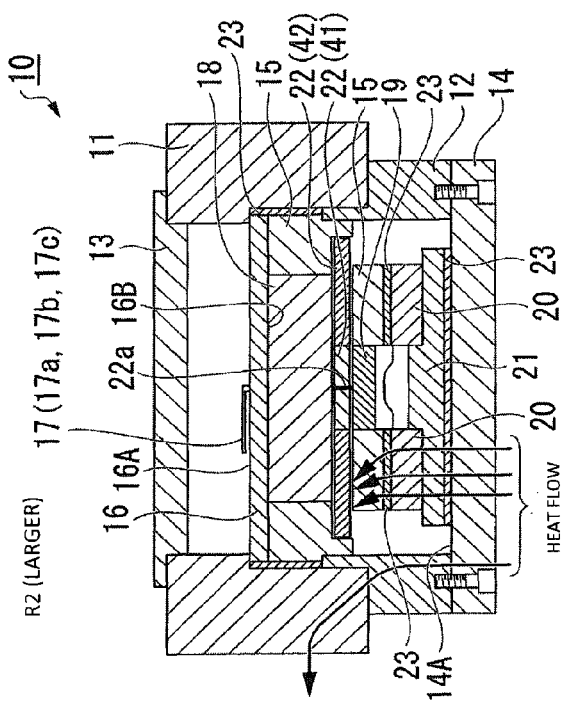
FIG. 9 is a view showing the state of the movable member in the state where the thermal resistance of the region including the housing and the holding member becomes the first thermal resistance with a smaller value and the state where the thermal resistance of the region becomes the second thermal resistance with a larger value, in the thermal power generation portable device related to a first modification example of the embodiment of the invention.
Figure 9A:
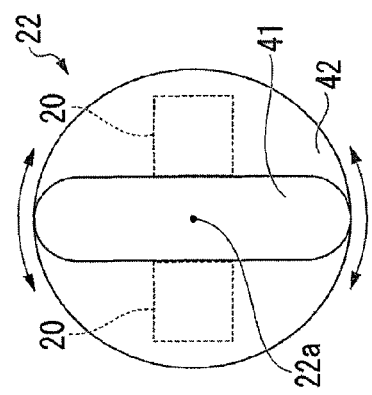
Figure 9B:
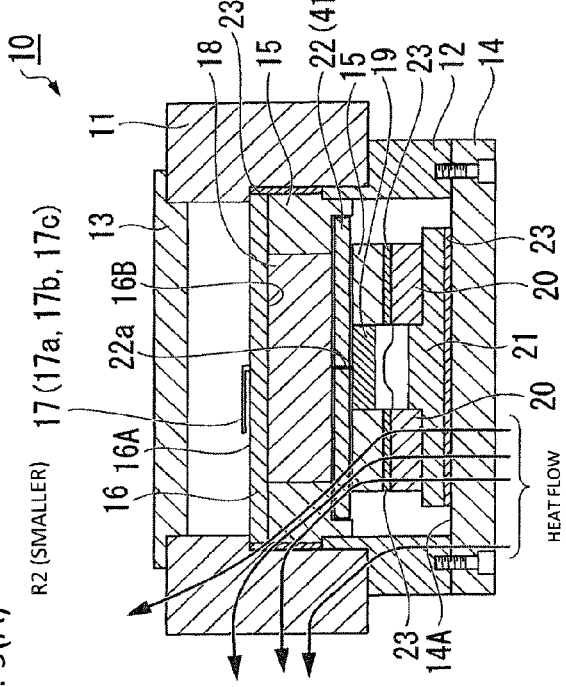
Figure 9B:
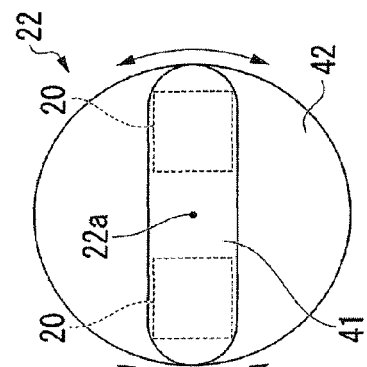

Also, the first member 41 of the movable member 22, for example, is formed so as to have, for example as shown in FIG. 9(A), a shape capable of being superimposed so as to cover the two thermal power generating members 20 and 20 in the direction of the long side and so as to have, for example as shown in FIG. 9(B), a shape (that is, a shape of which the length in the direction of the short side is shorter than the interval between the two thermal power generating members 20 and 20) of being not superimposed on the two thermal power generating members 20 and 20 such that the movable member fits between the two thermal power generating members 20 and 20 in the direction of the short side, when the two thermal power generating members 20 and 20 arranged at positions point-symmetrical with respect to the axial center of the rotating shaft 22a are viewed from the direction that faces the rear lid 14 from the cover glass 13.

Also, the second member 42 of the movable member 22 has a shape of being superimposed so as to cover the two thermal power generating members 20 and 20, as shown in FIG. 9(B) in a state where the first member 41 is not superimposed on the two thermal power generating members 20 and 20.

As a result, for example, switching to a case where the flow of heat sequentially transferred to the rear lid 14, the heat-conducting member 21, the thermal power generating member 20, the holding member 15, and the housing 11 goes through the first member 41 of the movable member 22 as shown in FIG. 9(A), and a case where the heat flow goes through the second member 42 of the movable member 22 as shown in FIG. 9(B) is made according to the rotation of the movable member 22, and the thermal resistance R2 of the region including the holding member 15 and the housing 11 that house the movable member 22 therein changes.

In addition, in the above-described embodiment, the movable member 22 has a shape point-symmetrical with respect to the axial center of the rotating shaft 22a. However, the invention is not limited to this. For example as in a second modification example shown in FIGS. 10(A) and 10(B), the movable member 22 may be formed so as to have a shape non-point-symmetrical with respect to the axial center of the rotating shaft 22a.

The movable member 22 of the thermal power generation portable device 10 related to this second modification example, for example, is formed in the shape of an elliptical plate or a lengthy plate from metal or the like, and the rotating shaft 22a is provided at a position shifted from a center, for example, a position of one end portion in the direction of the long side.

Figure 10A:
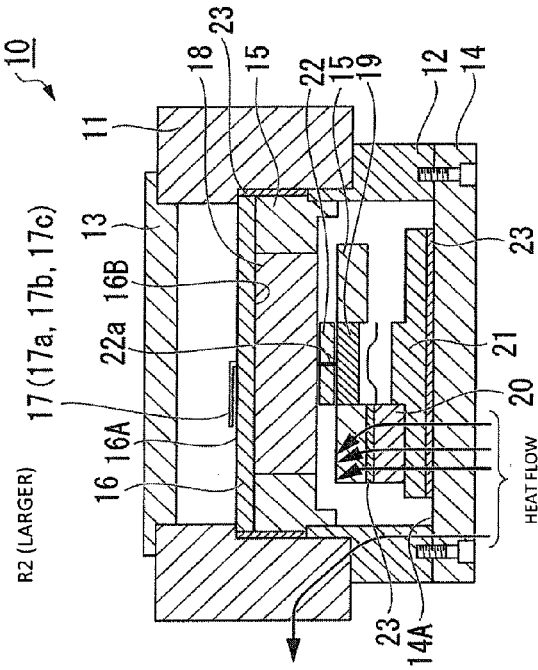
FIG. 10 is a view showing the state of the movable member in the state where the thermal resistance of the region including the housing and the holding member becomes the first thermal resistance with a smaller value and the state where the thermal resistance of the region becomes the second thermal resistance with a larger value, in the thermal power generation portable device related to a second modification example of the embodiment of the invention.
Figure 10A:
Figure 10B:
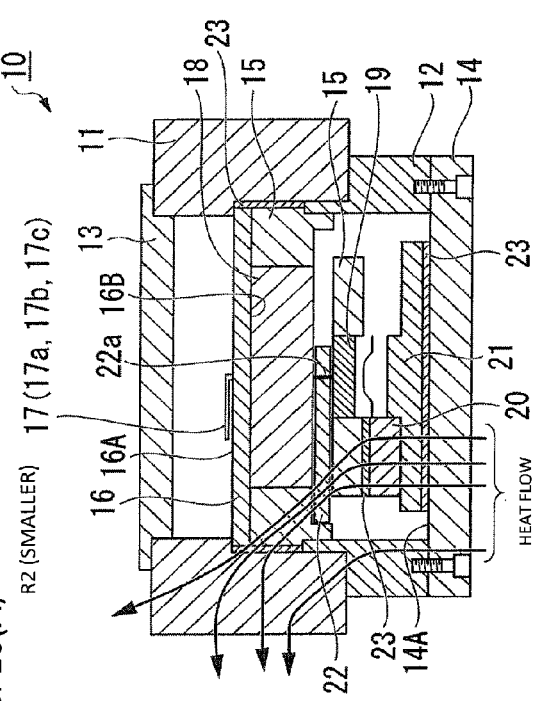

Also, the movable member 22, for example, is formed so as to have, for example as shown in FIG. 10(A), a shape capable of being superimposed so as to cover a thermal power generating member 20 from one end portion in the direction of the long side toward the other end portion and so as to have, for example as shown in FIG. 10(B), a shape (that is, such a shape that the length from the axial center of the rotating shaft 22a from the other end portion in the direction of the short side or in the direction of the long side toward one end portion is shorter than the interval from the axial center of the rotating shaft 22a to the thermal power generating member 20) of being not superimposed on the thermal power generating member 20 from the other end portion in the direction of the short side or in the direction of the long side toward one end portion, when the thermal power generating member 20 arranged at a position shifted from the axial center of the rotating shaft 22a is viewed from the direction that faces the rear lid 14 from the cover glass 13.

As a result, for example, switching to the case where the flow of heat sequentially transferred to the rear lid 14, the heat-conducting member 21, the thermal power generating member 20, the holding member 15, and the housing 11 goes through the movable member 22 as shown in FIG. 10(A), and a case where the heat flow goes through the inside of the atmosphere (air or the like) inside the holding member 15 without going through the movable member 22 as shown in FIG. 10(B) is made according to the rotation of the movable member 22, and the thermal resistance R2 of the region including the holding member 15 and the housing 11 that house the movable member 22 therein changes.

According to this second modification example, the rotational property of the movable member 22 caused by, for example, the action of gravity is enhanced. Therefore, the presence or absence of interference (that is, intersection) with the heat transfer path accompanying the rotation of the movable member 22 can be easily induced, and the thermal resistance R2 of at least a portion (that is, the region including the holding member 15 and the housing 11) of the heat transfer path can be easily changed.

In addition, in the above-described embodiment, a member drive unit 51 that automatically drives the movable member 22 may be included as in the thermal power generation portable device 10 related to the third modification example shown in FIGS. 11(A) and 11(B).

Figure 12:
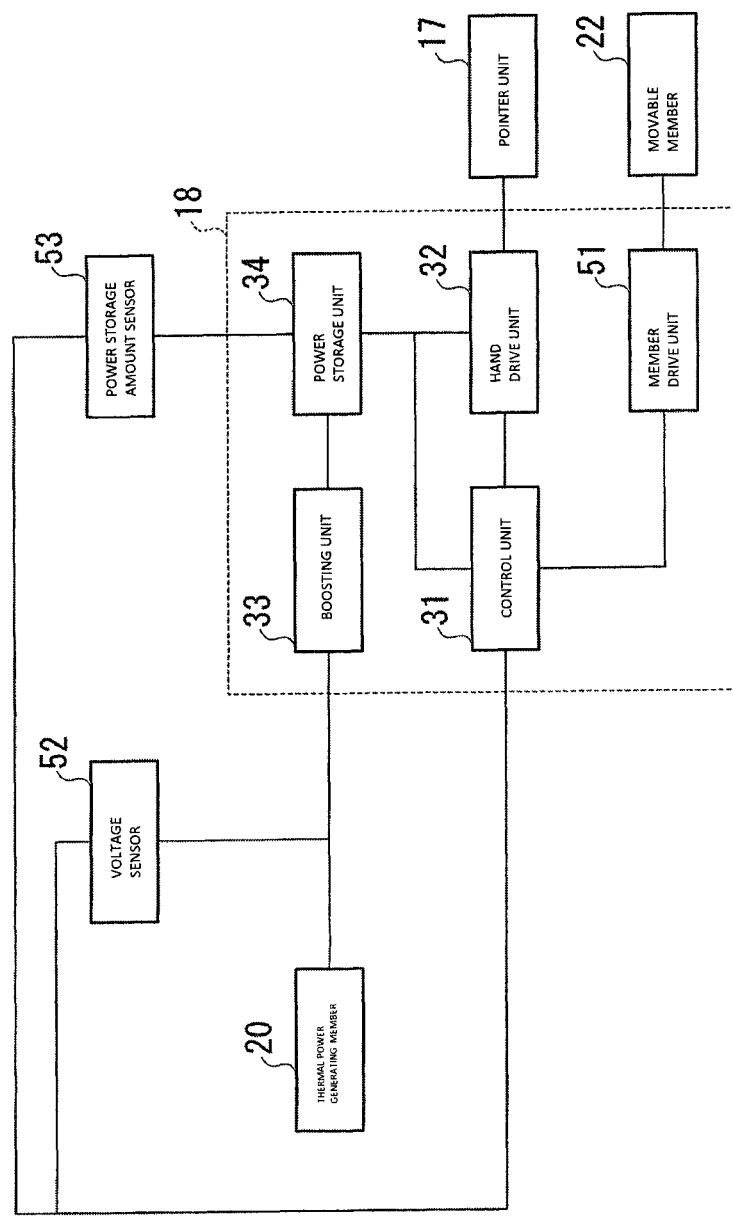
FIG. 12 is a configuration view of the movement of the thermal power generation portable device related to the third modification example of the embodiment of the invention.

The thermal power generation portable device 10 related to this third modification example, for example as shown in FIG. 12, includes a voltage sensor 52 that detects the power generation voltage of the thermal power generating member 20, and a power storage amount sensor 53 that detects the power storage amount of the power storage unit 34.

The member drive unit 51 includes, for example, a motor that is included in the movement 18 and rotationally drives the movable member 22, and automatically drives the movable member 22 while controlling timing, a rotating speed, or the like at which the movable member 22 is rotationally driven, according to at least any one out of a signal serving as a reference for timing output from the control unit 31, a signal of the detection result of the power generation voltage output from the voltage sensor 52, and a signal of the detection result of the power storage amount output from the power storage amount sensor 53.

Hereinafter, the operation, that is, power generation control method of the thermal power generation portable device related to this third modification example will be described.

For example, the member drive unit 51 rotationally drives the movable member 22 and changes the thermal resistance R2 of the region including the holding member 15 and the housing 11 that house the movable member 22 therein, in interlocking with at least any one out of the second hand 17a, the minute hand 17b, and the hour hand 17c of the pointer unit 17, according to a preset time, on the basis of the signal serving as a reference for timing output from the control unit 31.

As a result, switching to the case where the flow of heat sequentially transferred to the rear lid 14, the heat-conducting member 21, the thermal power generating member 20, the holding member 15, and the housing 11 goes through the movable member 22 as shown in FIG. 11(A), and the case where the heat flow goes through the inside of the atmosphere (air or the like) inside the holding member 15 without going through the movable member 22 as shown in FIG. 11(B) is made, and the thermal resistance R2 is switched to the first thermal resistance R2a and the second thermal resistance R2b.

Additionally, the member drive unit 51 rotationally drives the movable member 22 to set the thermal resistance R2 to the first thermal resistance R2a with a smaller value so that the heat flow goes through the movable member 22 as shown in FIG. 11(A), when the power generation voltage is equal to or more than a predetermined threshold (for example, a lower limit voltage at which the boosting operation of the boosting unit 33 is possible or a lower limit voltage required for the operation of the thermal power generation portable device 10), on the basis of the signal of the detection result of the power generation voltage output from the voltage sensor 52.

Then, after the power generation voltage has become less than the predetermined threshold, the member drive unit rotationally drives the movable member 22 to temporarily increase the thermal resistance R2 to the second thermal resistance R2b with a larger value so that the heat flow goes through the inside of the atmosphere (air or the like) inside the holding member 15 without going through the movable member 22 as shown in FIG. 11(B) temporarily (in the predetermined period ranging from the time t2 to the time t3 shown in FIG. 8, or the like).

Then, for example after the lapse of the predetermined period, or the like, the member drive unit rotationally drives the movable member 22 to set the thermal resistance R2 to the first thermal resistance R2a with a smaller value so that the heat flow goes through the movable member 22 again as shown in FIG. 11(A).

Additionally, the member drive unit 51 rotationally drives the movable member 22 to set the thermal resistance R2 to the first thermal resistance R2a with a smaller value so that the heat flow goes through the movable member 22 as shown in FIG. 11(A), when the power storage amount is equal to or more than the predetermined threshold (for example, a lower limit electric power or the like required for the operation of the thermal power generation portable device 10), on the basis of the signal of the detection result of the power storage amount output from the power storage amount sensor 53.

Then, after the power storage amount has become less than the predetermined threshold, the member drive unit rotationally drives the movable member 22 to temporarily increase the thermal resistance R2 to the second thermal resistance R2b with a larger value so that the heat flow goes through the inside of the atmosphere (air or the like) inside the holding member 15 without going through the movable member 22 as shown in FIG. 11(B) temporarily (in the predetermined period ranging from the time t2 to the time t3 shown in FIG. 8, or the like).

Then, for example after the lapse of the predetermined period, or the like, the member drive unit rotationally drives the movable member 22 to set the thermal resistance R2 to the first thermal resistance R2a with a smaller value so that the heat flow goes through the movable member 22 again as shown in FIG. 11(A).

According to this third modification example, a desired power generation voltage and a desired power generation capacity can be easily ensured and a reduction in power generation efficiency can be suppressed by automatically changing the thermal resistance R2 of at least a portion (that is, the region including the holding member 15 and the housing 11) of the heat transfer path, for example, according to a predetermined period or time, for example, according to a drop in the power generation voltage of the thermal power generating member 20, or for example, according to a reduction in the power storage amount of the power storage unit 34.

In addition, in this third modification example, the member drive unit 51 may be, for example, a drive mechanism that rotationally drives the movable member 22 with the power of the hand drive unit 32, and may be configured to include, for example, a mechanism that disconnects or connects the transmission of power of the hand drive unit 32 with respect to the movable member 22, a speed change mechanism, or the like.

Additionally, in this third modification example, at least the voltage sensor 52 or the power storage amount sensor 53 may be omitted. In this case, the driving of the movable member 22 is controlled on the basis of at least the signal serving as a reference for timing output from the control unit 31.

In addition, in the above-described embodiment, the presence or absence of interference (that is, intersection) with the heat transfer path changes according to the rotation of the movable member 22 around the rotating shaft 22a. However, the invention is not limited to this. For example as in the fourth modification example shown in FIGS. 13(A) and 13(B), a configuration may be adopted in which the presence or absence of interference (that is, intersection) with the heat transfer path changes according to sliding movement of the movable member 22.

The movable member 22 of the thermal power generation portable device 10 related to this fourth modification example, for example, is formed in the shape of an elliptical plate or a lengthy plate from metal or the like, and is housed inside the holding member 15 so as to be slidingly movable in the direction of the long side.

Also, the movable member 22, for example, is formed so as to have, for example as shown in FIG. 13(A), a shape capable of being superimposed so as to cover a thermal power generating member 20 in a state where the movable member has moved to one side in a sliding direction and so as to have, for example as shown in FIG. 13(B), a shape (that is, a shape of which the length in the direction of the long side is shorter than the interval from the other end portion in the sliding direction to the thermal power generating member 20 in a slidingly movable range) of being not superimposed on the thermal power generating member 20 in a state where the movable member has moved to the other side in the sliding direction, when the thermal power generating member 20 arranged at a position shifted from one side in a sliding direction of the movable member 22 from the center of the thermal power generation portable device 10 is viewed from the direction that faces the rear lid 14 from the cover glass 13.

As a result, for example, switching to the case where the flow of heat sequentially transferred to the rear lid 14, the heat-conducting member 21, the thermal power generating member 20, the holding member 15, and the housing 11 goes through the movable member 22 as shown in FIG. 13(A), and the case where the heat flow goes through the inside of the atmosphere (air or the like) inside the holding member 15 without going through the movable member 22 as shown in FIG. 13(B) is made according to the sliding movement of the movable member 22, and the thermal resistance R2 of the region including the holding member 15 and the housing 11 that house the movable member 22 therein changes.

According to this fourth modification example, the presence or absence of interference (that is, intersection) with the heat transfer path accompanying the sliding movement of the movable member 22 for example can be easily induced by rocking of the thermal power generation portable device 10, or the like, and the thermal resistance R2 of at least a portion (that is, the region including the holding member 15 and the housing 11) of the heat transfer path can be easily changed.

Figure 14A:
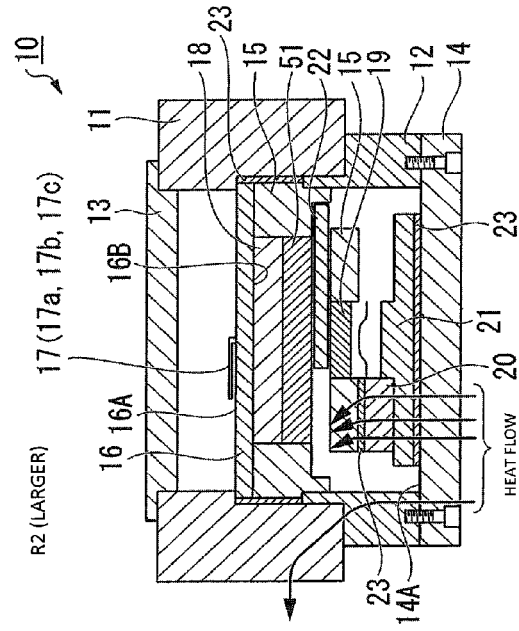
FIG. 14 is a view showing the state of the movable member in the state where the thermal resistance of the region including the housing and the holding member becomes the first thermal resistance with a smaller value and the state where the thermal resistance of the region becomes the second thermal resistance with a larger value, in the thermal power generation portable device related to a fifth modification example of the embodiment of the invention.
Figure 14A:
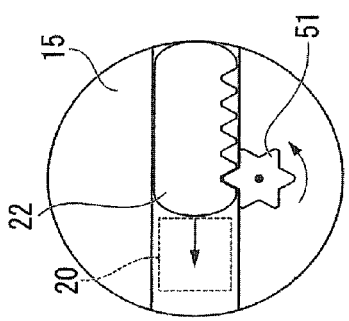
Figure 14B:
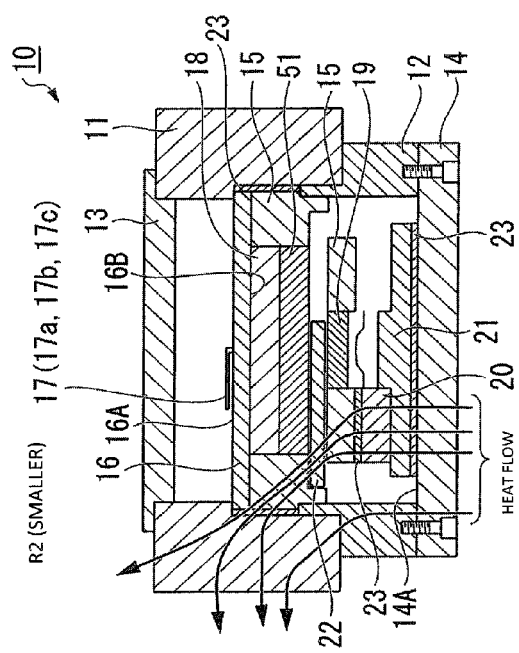
Figure 14B:
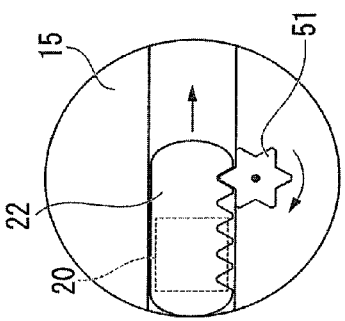

In addition, in the fourth modification example of the above-described embodiment, the member drive unit 51 that automatically drives the movable member 22 may be included as in the thermal power generation portable device 10 related to the fifth modification example shown in FIGS. 14(A) and 14(B).

The thermal power generation portable device 10 related to this fifth modification example, for example similar to the third modification example of the above-described embodiment, as shown in FIG. 12, includes the voltage sensor 52 that detects the power generation voltage of the thermal power generating member 20, and the power storage amount sensor 53 that detects the power storage amount of the power storage unit 34.

The member drive unit 51 includes, for example, a gear mechanism, such as a motor and a rack and pinion, which is included in the movement 18 and slidingly moves the movable member 22, and is automatically slidingly moved the movable member 22 while controlling timing, a moving speed, or the like at which the movable member 22 is slidingly moved, according to at least any one out of the signal serving as a reference for timing output from the control unit 31, the signal of the detection result of the power generation voltage output from the voltage sensor 52, and the signal of the detection result of the power storage amount output from the power storage amount sensor 53.

Hereinafter, the operation, that is, power generation control method of the thermal power generation portable device related to this fifth modification example will be described.

For example, the member drive unit 51 slidingly moves the movable member 22 and changes the thermal resistance R2 of the region including the holding member 15 and the housing 11 that house the movable member 22 therein, in interlocking with at least any one out of the second hand 17a, the minute hand 17b, and the hour hand 17c of the pointer unit 17, according to a preset time, on the basis of the signal serving as a reference for timing output from the control unit 31.

As a result, switching to the case where the flow of heat sequentially transferred to the rear lid 14, the heat-conducting member 21, the thermal power generating member 20, the holding member 15, and the housing 11 goes through the movable member 22 as shown in FIG. 14(A), and the case where the heat flow goes through the inside of the atmosphere (air or the like) inside the holding member 15 without going through the movable member 22 as shown in FIG. 14(B) is made, and the thermal resistance R2 is switched to the first thermal resistance R2a and the second thermal resistance R2b.

Additionally, the member drive unit 51 slidingly moves the movable member 22 to set the thermal resistance R2 to the first thermal resistance R2a with a smaller value so that the heat flow goes through the movable member 22 as shown in FIG. 14(A), when the power generation voltage is equal to or more than the predetermined threshold (for example, the lower limit voltage at which the boosting operation of the boosting unit 33 is possible or the lower limit voltage required for the operation of the thermal power generation portable device 10), on the basis of the signal of the detection result of the power generation voltage output from the voltage sensor 52.

Then, after the power generation voltage has become less than the predetermined threshold, the member drive unit slidingly moves the movable member 22 to temporarily increase the thermal resistance R2 to the second thermal resistance R2b with a larger value so that the heat flow goes through the inside of the atmosphere (air or the like) inside the holding member 15 without going through the movable member 22 as shown in FIG. 14(B) temporarily (in the predetermined period ranging from the time t2 to the time t3 shown in FIG. 8, or the like).

Then, for example after the lapse of the predetermined period, or the like, the member drive unit slidingly moves the movable member 22 to set the thermal resistance R2 to the first thermal resistance R2a with a smaller value so that the heat flow goes through the movable member 22 again as shown in FIG. 14(A).

Additionally, the member drive unit 51 slidingly moves the movable member 22 to set the thermal resistance R2 to the first thermal resistance R2a with a smaller value so that the heat flow goes through the movable member 22 as shown in FIG. 14(A), when the power storage amount is equal to or more than the predetermined threshold (for example, the lower limit electric power or the like required for the operation of the thermal power generation portable device 10), on the basis of the signal of the detection result of the power storage amount output from the power storage amount sensor 53.

Then, after the power storage amount has become less than the predetermined threshold, the member drive unit slidingly moves the movable member 22 to temporarily increase the thermal resistance R2 to the second thermal resistance R2b with a larger value so that the heat flow goes through the inside of the atmosphere (air or the like) inside the holding member 15 without going through the movable member 22 as shown in FIG. 14(B) temporarily (in the predetermined period ranging from the time t2 to the time t3 shown in FIG. 8, or the like).

Then, for example after the lapse of the predetermined period, or the like, the member drive unit slidingly moves the movable member 22 to set the thermal resistance R2 to the first thermal resistance R2a with a smaller value so that the heat flow goes through the movable member 22 again as shown in FIG. 14(A).

According to this fifth modification example, a desired power generation voltage and a desired power generation capacity can be easily ensured and a reduction in power generation efficiency can be suppressed by automatically changing the thermal resistance R2 of at least a portion (that is, the region including the holding member 15 and the housing 11) of the heat transfer path, for example, according to a predetermined period or time, for example, according to a drop in the power generation voltage of the thermal power generating member 20, or for example, according to a reduction in the power storage amount of the power storage unit 34.

In addition, the member drive unit 51 may be, for example, a drive mechanism that slidingly moves the movable member 22 with the power of the hand drive unit 32, and may be configured to include, for example, a mechanism that disconnects or connects the transmission of power of the hand drive unit 32 with respect to the movable member 22, a speed change mechanism, or the like.

Additionally, in this fifth modification example, at least the voltage sensor 52 or the power storage amount sensor 53 may be omitted. In this case, the driving of the movable member 22 is controlled on the basis of the signal serving as a reference for timing output from the control unit 31.

In addition, in the third modification example and the fifth modification example of the above-described embodiment, the member drive unit 51 that automatically drives the movable member 22 is included. However, the invention is not limited to this. For example as in the thermal power generation portable device 10 related to a sixth modification example shown in FIGS. 15(A) and 15(B), a manual operation member 61 capable of manually operating the movable member 22 may be included.

The manual operation member 61 is configured to include, for example, an operating member 61a that protrude to the outside from above the surface of the thermal power generation portable device 10 and is capable of being input-operated (for example, a sliding operation) by an operator's hand, and a drive unit 61b including a gear mechanism that converts the input operation to the operating member 61a into driving (for example, sliding movement) of the movable member 22.

Figures 15A, 15B:
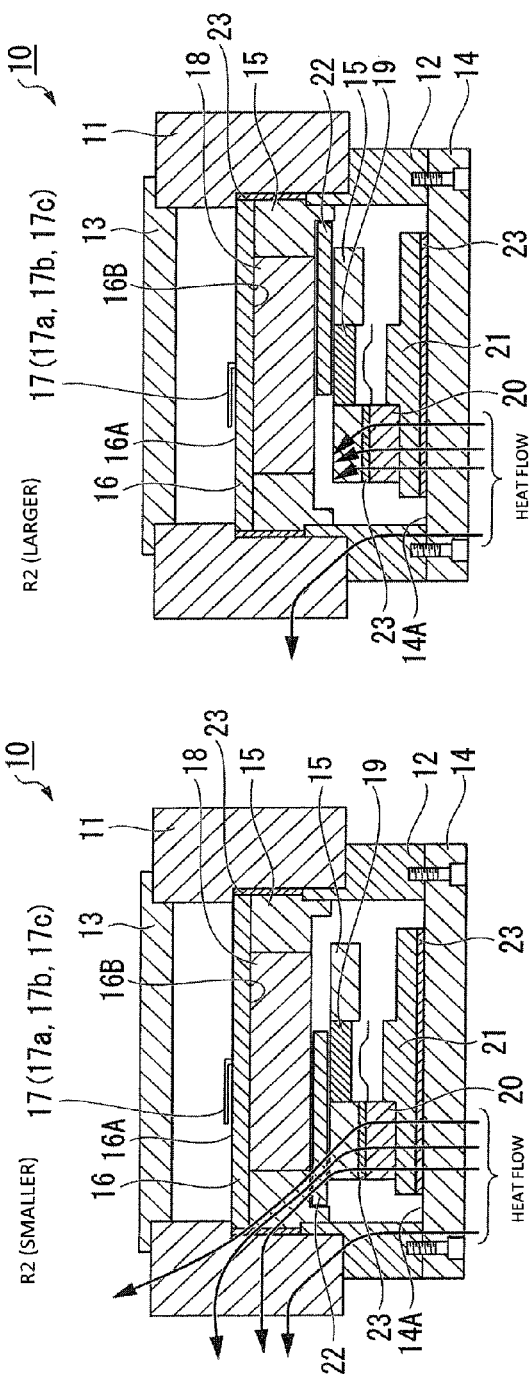
FIG. 15 is a view showing the state of the movable member in the state where the thermal resistance of the region including the housing and the holding member becomes the first thermal resistance with a smaller value and the state where the thermal resistance of the region becomes the second thermal resistance with a larger value, in the thermal power generation portable device related to a sixth modification example of the embodiment of the invention.

As a result, for example, switching to the case where the flow of heat sequentially transferred to the rear lid 14, the heat-conducting member 21, the thermal power generating member 20, the holding member 15, and the housing 11 goes through the movable member 22 as shown in FIG. 15(A), and the case where the heat flow goes through the inside of the atmosphere (air or the like) inside the holding member 15 without going through the movable member 22 as shown in FIG. 15(B) is made according to an operator's input operation to the operating member 61a of the manual operation member 61, and the thermal resistance R2 of the region including the holding member 15 and the housing 11 that house the movable member 22 therein changes.

According to this sixth modification example, a desired power generation voltage and a desired power generation capacity can be ensured according to an operator's intention, and a reduction in power generation efficiency can be suppressed.

In addition, the manual operation member 61 may be formed so that the correspondence between the various input operations (for example, a sliding operation, a rotation operation, depression operation, or the like) for the operating member 61a and the driving (for example, sliding movement, rotational driving, or the like) of the movable member 22 has an appropriate combination.

In addition, in the sixth modification example of the above-described embodiment, the manual operation member 61 capable of manually operating the movable member 22 is included. However, the invention is not limited to this. For example as in the thermal power generation portable device 10 related to a seventh modification example shown in FIGS. 16(A) and 16(B), a movement assisting mechanism 62 that assists in the movement of the movable member 22 and a fixing mechanism 63 capable of fixing the movable member 22 may be further included.

The movement assisting mechanism 62 is configured to include, for example, an elastic member, such as a spring, which has one end connected to the holding member 15 and the other end connected to the movable member 22, and assists in a predetermined movement (for example, sliding movement that goes from the other side to one side in the sliding direction) of the movable member 22 according to the elastic force of the elastic member.

The fixing mechanism 63 is configured to include, for example, an engaging member 63a that is engaged with an engaging recess 22b provided on the surface of the movable member 22 and is capable of fixing the movable member 22, and a controlling mechanism (not shown) that controls engagement and disengagement of the engaging member 63a.

Figure 16A:
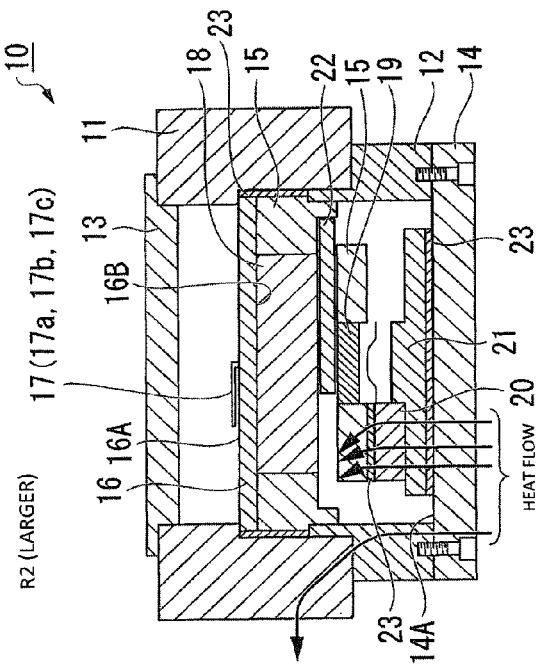
FIG. 16 is a view showing the state of the movable member in the state where the thermal resistance of the region including the housing and the holding member becomes the first thermal resistance with a smaller value and the state where the thermal resistance of the region becomes the second thermal resistance with a larger value, in the thermal power generation portable device related to a seventh modification example of the embodiment of the invention.
Figure 16A:
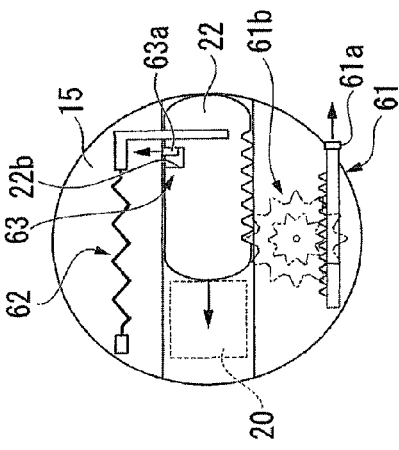

Also, for example as shown in FIG. 16(A), setting is made so that the elastic member of the movement assisting mechanism 62 is in a natural state and any elastic force does not act on the movable member 22 and so that the engaging member 63a of the fixing mechanism 63 is brought into a disengagement state, in a state where the movable member 22 moves to one side in a sliding direction according to an input operation to the manual operation member 61 and the movable member 22 is superimposed so as to cover the thermal power generating member 20 as viewed from the direction that faces the rear lid 14 from the cover glass 13.

In this case, for example, the flow of heat sequentially transferred to the rear lid 14, the heat-conducting member 21, and the thermal power generating member 20, the holding member 15, the housing 11 goes through the movable member 22, and the thermal resistance R2 of the region including the holding member 15 and the housing 11 that houses the movable member 22 therein is set to the first thermal resistance R2a with a smaller value.

Figure 16B:
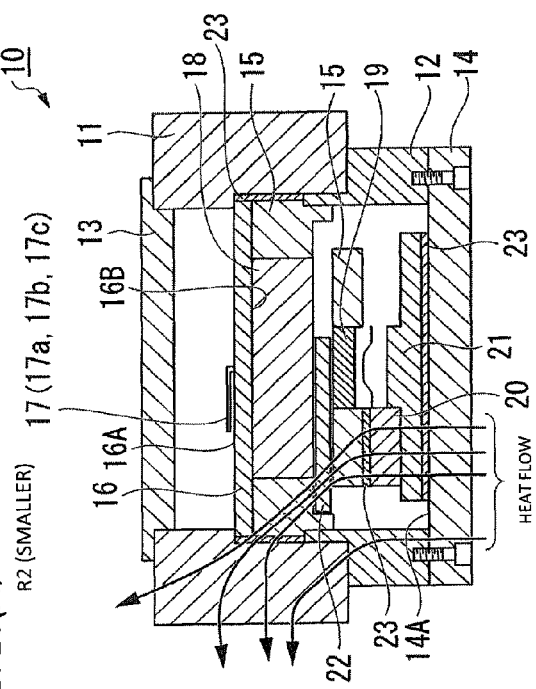
Figure 16B:
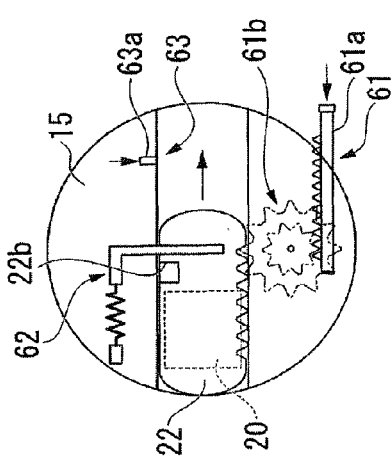

Also, for example as shown in FIG. 16(B), setting is made so that the elastic member of the movement assisting mechanism 62 is elastically deformed and an elastic force faces one side in the sliding direction acts on the movable member 22 and so that the engaging member 63a of the fixing mechanism 63 is engaged with the engaging recess 22b of the movable member 22 to fix the movable member 22, in a state where the movable member 22 moves to the other side in the sliding direction according to an input operation to the manual operation member 61 and the movable member 22 does not superimpose the thermal power generating member 20 as viewed from the direction that faces the rear lid 14 from the cover glass 13.

In this case, for example, the flow of heat sequentially transferred to the rear lid 14, the heat-conducting member 21, the thermal power generating member 20, the holding member 15, and the housing 11 does not go through the movable member 22 but goes through the atmosphere (air or the like) inside the holding member 15, and the thermal resistance R2 of the region including the holding member 15 and the housing 11 that house the movable member 22 therein is set to the second thermal resistance R2b with a larger value.

The controlling mechanism (not shown) of the fixing mechanism 63, for example, is set so as to hold the engagement state of the engaging member 63 only for a predetermined period. Therefore, after lapse of a predetermined period after the engaging member 63a is engaged with the engaging recess 22b of the movable member 22, the engagement between the engaging member 63a and the engaging recess 22b is automatically released.

Along with this, the movable member 22 moves toward one side in the sliding direction according to the elastic force of the elastic member of the movement assisting mechanism 62, and as shown in FIG. 16(A), the movable member 22 is superimposed so as cover the thermal power generating member 20 as viewed from the direction that faces the rear lid 14 from the cover glass 13. As a result, the thermal resistance R2 of the region including the holding member 15 and the housing 11 that house the movable member 22 therein is set to the first thermal resistance R2a with a smaller value.

According to this seventh modification example, through the combination of a manual operation according to an operator's intention and the automatic driving of the movable member 22, a desired power generation voltage and a desired power generation capacity can be appropriately and easily ensured, and a reduction in power generation efficiency can be suppressed.

In addition, in the above-described embodiment, the movable member 22 is housed inside the holding member 15 and the thermal resistance R2 of the region including the holding member 15 and the housing 11 is changed according to the movement of the movable member 22. However, the invention is not limited to this, and the movable member 22 may be housed in other regions and the thermal resistance of other regions of the heat transfer path may be made variable.

Figure 17A:
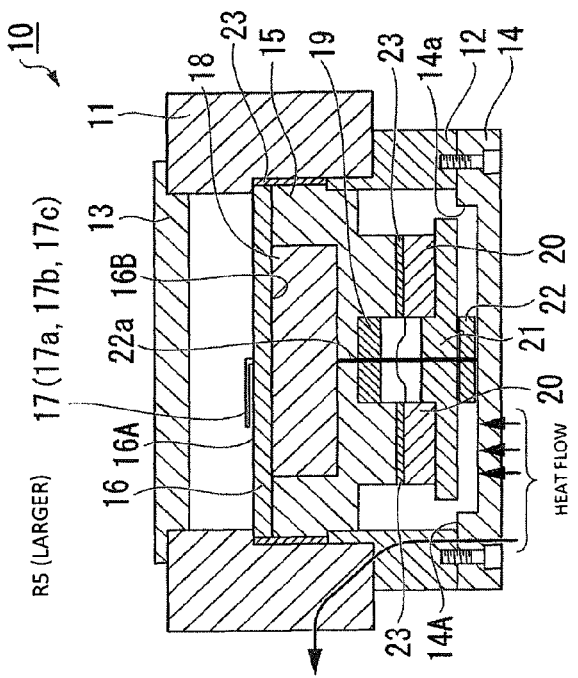
FIG. 17 is a view showing the state of the movable member in a state where the thermal resistance of a region including a rear lid and a heat-conducting member becomes the first thermal resistance with a smaller value and a state where the thermal resistance of the region becomes the second thermal resistance with a larger value, in the thermal power generation portable device related to an eighth modification example of the embodiment of the invention.
Figure 17A:
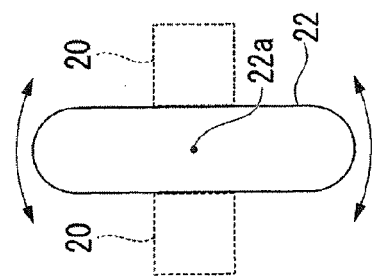
Figure 17B:
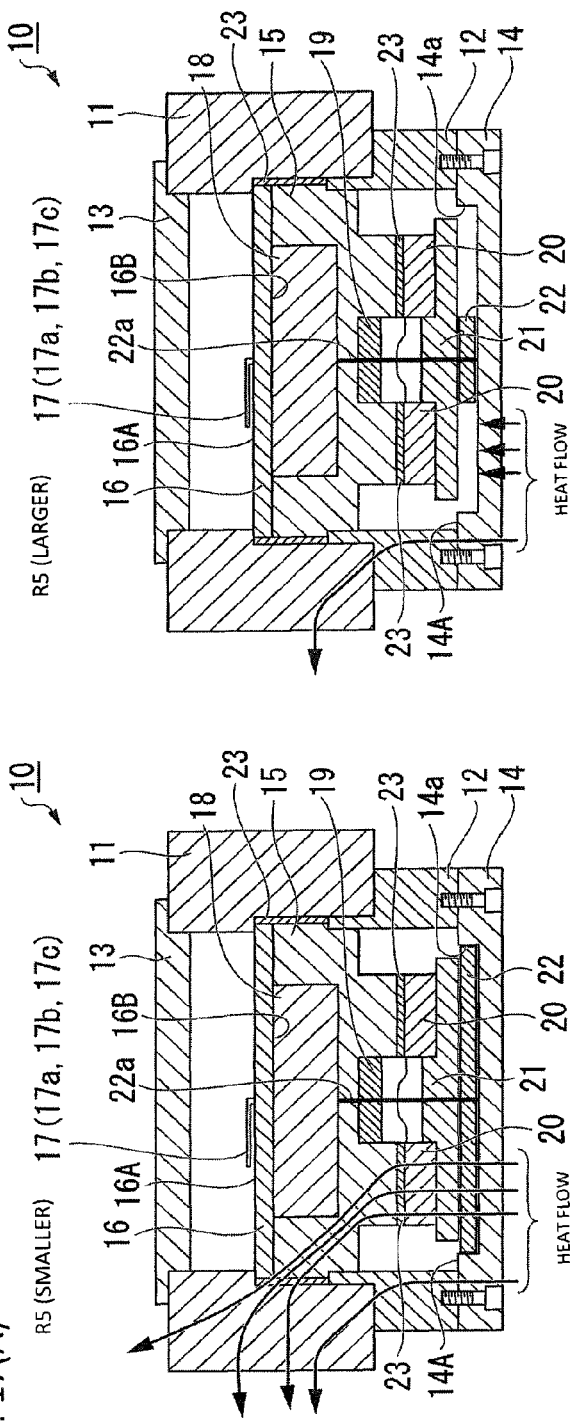
Figure 17B:

For example, in the thermal power generation portable device 10 related to an eighth modification example of the above-described embodiment shown in FIGS. 17(A) and 17(B), the movable member 22 is formed in the shape of an elliptical plate or a lengthy plate from metal or the like, is housed in a housing portion 14a including a recess provided on the inner surface 14A of the rear lid 14, and is supported so as to be rotatable around the rotating shaft 22a.

In the eighth modification example, the movable member 22, for example, is formed so as to have, for example as shown in FIG. 17(A), a shape capable of being superimposed so as to cover the two thermal power generating members 20 and 20 in the direction of the long side and so as to have, for example as shown in FIG. 17(B), a shape (that is, a shape of which the length in the direction of a short side is shorter than the interval between the two thermal power generating members 20 and 20) of being not superimposed on the two thermal power generating members 20 and 20 such that the movable member fits between the two thermal power generating members 20 and 20 in the direction of the short side, when the two thermal power generating members 20 and 20 arranged at positions point-symmetrical with respect to the axial center of the rotating shaft 22a are viewed from the direction that faces the rear lid 14 from the cover glass 13.

As a result, for example, switching to the case where the flow of heat sequentially transferred to the rear lid 14, the heat-conducting member 21, the thermal power generating member 20, the holding member 15, and the housing 11 goes through the movable member 22 as shown in FIG. 17(A), and a case where the heat flow goes through the inside of an atmosphere (air or the like) inside the housing portion 14a of the rear lid 14 without going through the movable member 22 as shown in FIG. 17(B) is made according to the rotation of the movable member 22.

Hereinafter, the operation of the thermal power generation portable device 10 related to this eighth modification example will be described.

Figure 18A:
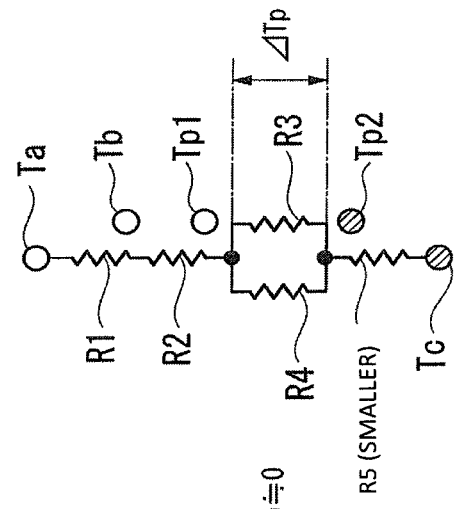
FIG. 18 is a view showing the thermal resistance of the region including the rear lid and the heat-conducting member which changes according to the state of the movable member and changes in temperature distribution in the thermal resistance model, after the thermal power generation portable device related to the eighth modification example of the embodiment of the invention is mounted to the living body.

For example, first, if the movable member 22 intersects the heat transfer path and thereby the thermal resistance R5 of the region including the rear lid 14 and the heat-conducting member 21 becomes a first thermal resistance R5a with a smaller value as shown in FIG. 17(A), in the initial state where the thermal power generation portable device 10 is mounted to the living body that is a heat source, a heat flow is transferred from the heat source via the region including the rear lid 14 and the heat-conducting member 21 to the heat-source-side position of the thermal power generating member 20 and the temperature Tp2 at the heat-source-side position rises, as shown in FIG. 18(A). On the other hand, the heat release destination-side position of the thermal power generating member 20 is cooled by the atmosphere outside the thermal power generation portable device 10 via the region including the heat release portion, the housing 11, and the holding member 15, and a rise in the temperature Tp1 at the heat release destination-side position is suppressed.

Figure 19:
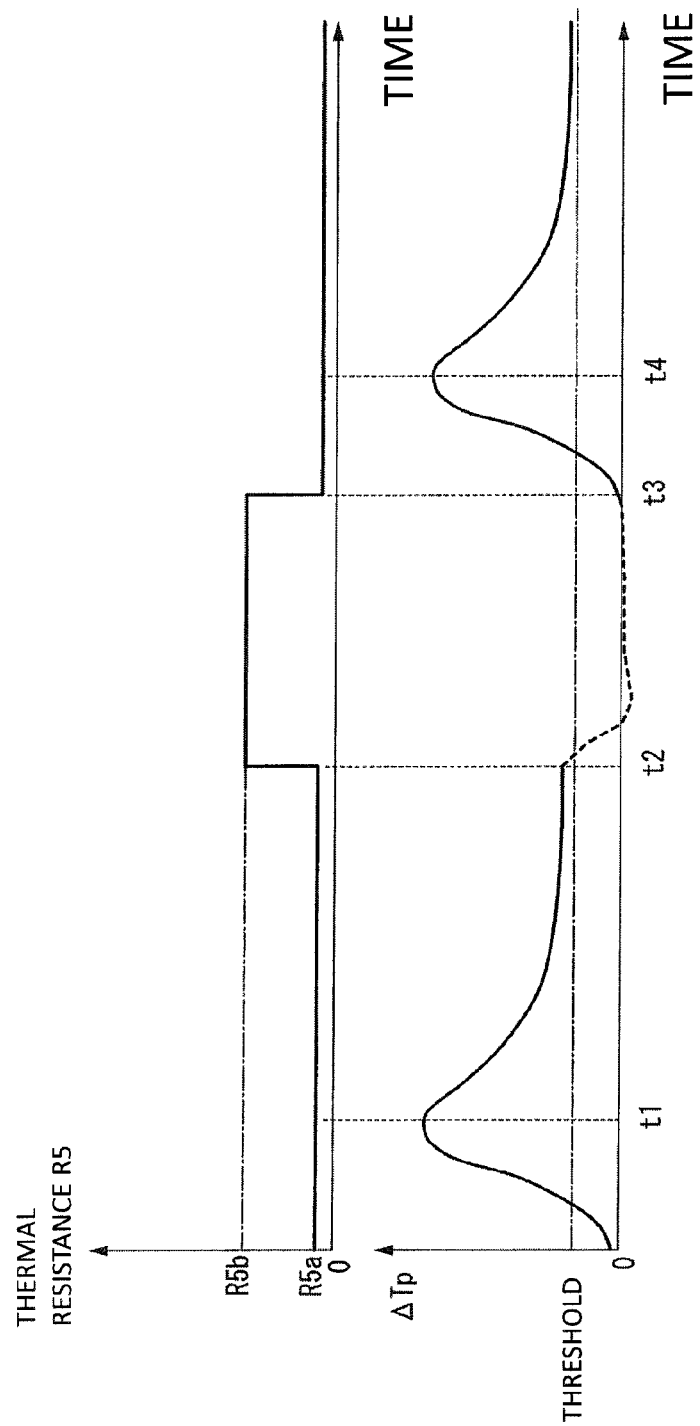
FIG. 19 is a view showing the thermal resistance of the region including the rear lid and the heat-conducting member which changes according to the state of the movable member and changes in the temperature difference $\Delta Tp$ caused between the temperature at the heat-source-side position and the temperature at the heat release destination-side position of the thermal power generating member, after the thermal power generation portable device related to the eighth modification example of the embodiment of the invention is mounted to the living body.

As a result, for example as in a period ranging to time t1 shown in FIG. 19, the temperature difference ΔTp (=Tp2−Tp1) caused between the temperature Tp2 at the heat-source-side position and the temperature Tp1 at the heat release destination-side position of the thermal power generating member 20 and the power generation voltage of the thermal power generating member 20 increases toward a maximum value.

Next, as the temperature of the whole thermal power generation portable device 10 changes toward the thermal equilibrium state so as to saturate, in other words, the predetermined temperature difference (Tc−Ta) between the heat source and the heat release destination is distributed over the whole heat transfer path, the local temperature gradient becomes small. As a result, for example as in the period ranging from the time t1 to time t2 shown in FIG. 19, the temperature difference ΔTp (=Tp2−Tp1) caused between the temperature Tp2 at the heat-source-side position and the temperature Tp1 at the heat release destination-side position of the thermal power generating member 20 and the power generation voltage of the thermal power generating member 20 changes with a reduction tendency.

Figure 18B:
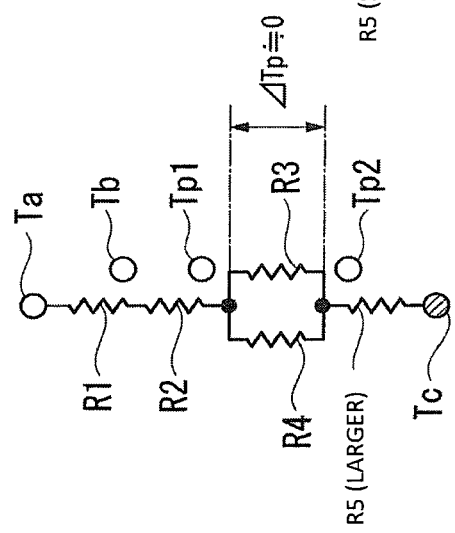

Next, if the movable member 22 rotates around the rotating shaft 22a, and as shown in FIG. 17(B), the movable member 22 no longer intersects the heat transfer path and thereby the thermal resistance R5 of the region including the rear lid 14 and the heat-conducting member 21 changes to a second thermal resistance R5b with a larger value, a heat flow transferred from the heat source to the rear lid 14 is dammed in, for example, the region including the rear lid 14 and the heat-conducting member 21 as shown in FIG. 18(B).

As a result, as in a period from the time t2 to time t3 shown in FIG. 19, the thermal power generating member 20 is easily cooled by the atmosphere outside the thermal power generation portable device 10 via the region including the heat release portion, the housing 11, and the holding member 15, the temperature Tp2 at the heat-source-side position of the thermal power generating member 20 drops so as to become equal to the temperature Tp1 at the heat release destination-side position, and the temperature difference ΔTp and the power generation voltage of the thermal power generating member 20 changes toward zero with a reduction tendency.

That is, the movable member 22 rotates around the rotating shaft 22a and thereby the temperature distribution in the heat transfer path between the heat source and the heat release destination is changed, and the temperature difference between the temperature Tp2 at the heat-source-side position of the thermal power generating member 20 and the temperature Tc of the heat source region increases.

As a result, for example, the thermal equilibrium state where the predetermined temperature difference (Tc−Ta) between the heat source and the heat release destination, is distributed over the whole heat transfer path is changed, and the thermal equilibrium state where this predetermined temperature difference (Tc−Ta) is locally concentrated on a portion (that is, the region including the rear lid 14 and the heat-conducting member 21) of the heat transfer path is formed.

Figure 18C:
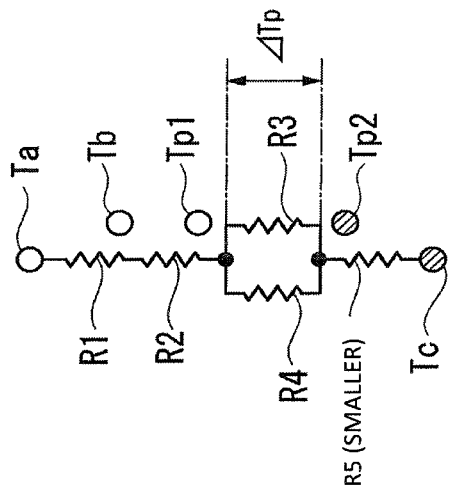

Next, if the movable member 22 rotates around the rotating shaft 22a, and as shown in FIG. 17(A), the movable member 22 intersects the heat transfer path again and thereby the thermal resistance R5 of the region including the rear lid 14 and the heat-conducting member 21 changes to the first thermal resistance R5a with a smaller value as shown in FIG. 18(C), the heat-source-side position of the thermal power generating member 20 is heated by the heat source via the region including the rear lid 14 and the heat-conducting member 21, and the temperature Tp2 at the heat-source-side position rises.

As a result, for example as in a period from the time t3 to time t4 shown in FIG. 19, the temperature difference ΔTp (=Tp2−Tp1) caused between the temperature Tp2 at the heat-source-side position and the temperature Tp1 at the heat release destination-side position of the thermal power generating member 20 and the power generation voltage of the thermal power generating member 20 increases toward the maximum value, in the thermal transient state where the temperature Tp2 at the heat-source-side position of the thermal power generating member 20 rises.

Also, for example as in a period after the time t4 shown in FIG. 19, as the temperature of the whole thermal power generation portable device 10 changes toward the thermal equilibrium state so as to saturate, in other words, the predetermined temperature difference (Tc−Ta) between the heat source and the heat release destination is distributed over the whole heat transfer path, the local temperature gradient becomes small after the temperature difference ΔTp (=Tp2−Tp1) and the power generation voltage of the thermal power generating member 20 have reached the maximum value. As a result, the temperature difference ΔTp (=Tp2−Tp1) caused between the temperature Tp2 at the heat-source-side position and the temperature Tp1 at the heat release destination-side position of the thermal power generating member 20 and the power generation voltage of the thermal power generating member 20 changes with a reduction tendency.

In addition, the movable member 22 for making the thermal resistance R5 of the region including the rear lid 14 and the heat-conducting member 21 variable is not limited to that in which the presence or absence of interference (that is, intersection) with the heat transfer path or the position of interference (that is, intersection) with the heat transfer path changes with rotation or sliding movement. For example, a member, which is capable of protruding from the rear lid 14 toward the heat source and temporarily releases the direct contact between the rear lid 14 and the heat source, or the like may be adopted.

In this case, the thermal resistance R5 of the region including the rear lid 14 and the heat-conducting member 21 becomes the first thermal resistance R5a with a smaller value when the movable member 22 does not protrude from the rear lid 14, and the rear lid 14 and the heat source come into direct contact with each other. On the other hand, the thermal resistance R5 of the region including the rear lid 14 and the heat-conducting member 21 becomes the second thermal resistance R5b with a larger value when the movable member 22 protrudes from the rear lid 14 and the direct contact between the rear lid 14 and the heat source is released.

Additionally, for example in the thermal power generation portable device 10 related to the ninth modification example of the above-described embodiment shown in FIGS. 20(A) and 20(B), the movable member 22 is formed, for example, in a cylindrical shape that covers the front surface 11A of the cylindrical housing 11 and is rotatably mounted to the housing 11.

In this ninth modification example, the housing 11 is configured such that a plurality of members having different thermal resistances, for example, a first housing member 11a that is formed from metal or the like and has the first thermal resistance Ra and a second housing member 11b that is formed from resin or the like and has the second thermal resistance Rb larger than the first thermal resistance Ra are alternately arranged in the circumferential direction.

Also, the movable member 22 is configured such that a plurality of members having different thermal resistances, for example, a first member 71 that is formed from metal or the like and has the first thermal resistance Ra and a second member 72 that is formed from resin or the like and has the second thermal resistance Rb larger than the first thermal resistance Ra are alternately arranged in the circumferential direction.

As a result, for example, switching to a case where a flow of heat sequentially transferred to the rear lid 14, the heat-conducting member 21, the thermal power generating member 20, the holding member 15, and the first housing member 11a of the housing 11 goes through the first member 71 of the movable member 22 as shown in FIG. 20(A), and a case where the heat flow goes through the second member 72 of the movable member 22 as shown in FIG. 20(B) is made according to the rotation of the movable member 22, and switching to a state where the thermal resistance R1 of a heat release portion including the front surface of the thermal power generation portable device 10 to which the movable member 22 is mounted, and a region near the front surface becomes the first thermal resistance with a smaller value, and a state where the thermal resistance becomes the second thermal resistance with a larger value is made.

In addition, in the above-described embodiment and first to ninth modification examples, appropriate combinations of the respective thermal resistances R1, R2, and R5 may be made variable with the rotation or sliding movement of the movable member 22 as well as only any one of the respective thermal resistances R1, R2, and R5 is made variable.

That is, the movable member 22 may be configured to be capable of changing the thermal resistance of at least one out of between a living body and the thermal power generating member 20 and between the heat release destination and the thermal power generating member 20 in the heat transfer path from the heat source to the heat release destination.

Moreover, the thermal resistance R3 of the region including the frame body 12 and the atmosphere inside the frame body 12, which has a parallel connection relationship with respect to the thermal resistance R4 of the thermal power generating member 20 may be combined with at least any one of the respective thermal resistances R1, R2, and R5, and may be made variable with the rotation or sliding movement of the movable member 22.

Additionally, when the respective thermal resistances R1, R2, R3, and R5 are made variable, both of the member drive unit 51 that automatically drives the movable member 22 and the manual operation member 61 capable of manually operating the movable member 22 may be included.

Additionally, when the appropriate combinations of the respective thermal resistances R1, R2, R3, and R5 are made variable, both of the member drive unit 51 that automatically drives the movable member 22 and the manual operation member 61 capable of manually operating the movable member 22 may be included in appropriate combinations.

In addition, in the above-described embodiment, the wrist watch of analog display by the pointer unit 17 is adopted as the thermal power generation portable device 10. However, the invention is not limited to this, for example, a wrist watch of digital display by a liquid crystal display or the like may be adopted.

Additionally, in the above-described embodiment mentioned above, the wrist watch mounted to a human body is adopted as the thermal power generation portable device 10. However, the invention is not limited. As portable electric devices mounted to a human bodies or animals, for example, headphones, glasses for stereoscopic viewing, or portable electric devices that measures living body information on the pulse, the heart rate, the respiration rate, the blood pressure, the body temperature, or the like and wirelessly transmits the measurement results may be adopted.

REFERENCE SIGNS LIST

10: THERMAL POWER GENERATION PORTABLE DEVICE
11: HOUSING
14: REAR LID
15: HOLDING MEMBER
17a: SECOND HAND
17b: MINUTE HAND
17c: HOUR HAND
20: THERMAL POWER GENERATING MEMBER
22: MOVABLE MEMBER (THERMAL RESISTANCE CHANGING MEANS)
22a: ROTATING SHAFT
31: CONTROL UNIT (TIMING MEANS)
32: HAND DRIVE UNIT (HAND DRIVE MEANS)
34: POWER STORAGE UNIT (POWER STORAGE MEANS)
52: VOLTAGE SENSOR (VOLTAGE DETECTING MEANS)
53: POWER STORAGE AMOUNT SENSOR (POWER STORAGE AMOUNT DETECTING MEANS)
51: MEMBER DRIVE UNIT (THERMAL RESISTANCE CHANGING MEANS, MEMBER DRIVE MEANS)
61: MANUAL OPERATION MEMBER (THERMAL RESISTANCE CHANGING MEANS, MANUAL OPERATION MEMBER)

The invention claimed is:

1. A thermal power generation portable device configured to be mounted to a living body and capable of generating power with the heat of the living body, the thermal power generation portable device comprising:
a thermal power generating member that generates power on the basis of a temperature difference between a temperature at a heat-source-side position and a temperature at a heat release destination-side position between the living body that is a heat source and a heat release destination of heat released from the thermal power generation portable device; and
thermal resistance changing means for changing the thermal resistance of at least a portion of a heat transfer path between the living body and the heat release destination.

2. The thermal power generation portable device according to claim 1,
wherein the thermal resistance changing means is capable of switching a state where the thermal resistance of at least a portion of the heat transfer path becomes a first thermal resistance and a state where the thermal resistance of at least a portion of the heat transfer path becomes a second thermal resistance different from the first thermal resistance.

3. The thermal power generation portable device according to claim 1, wherein the thermal resistance changing means comprises a movable member mounted to undergo rotation around a rotational shaft or undergo sliding movement in a predetermined direction, the movable member being configured to change the thermal resistance of at least a portion of the heat transfer path as the presence or absence of interference with the heat transfer path or a change in the position of the interference with the heat transfer path in accordance with the rotation or the sliding movement.

4. The thermal power generation portable device according to claim 3, wherein the movable member comprises a plate-shaped member configured to intersect the heat transfer path.

5. The thermal power generation portable device according to claim 4, wherein the movable member is mounted to undergo rotation around the rotational shaft and has a shape that is point-symmetrical with respect to an axial center of the rotational shaft.

6. The thermal power generation portable device according to claim 4, wherein the movable member is mounted to undergo rotation around the rotational shaft and has a shape that is non-point-symmetrical with respect to an axial center of the rotational shaft.

7. The thermal power generation portable device according to claim 6, further comprising at least any one of clocking means for performing a clocking operation to count time, voltage detecting means for detecting a power generation voltage of the thermal power generation member, power storage means for storing the power generated by the thermal power generation member, and power storage amount detecting means for detecting the amount of power stored by the power storage means; wherein the thermal resistance changing means includes drive means for automatically driving the movable member in accordance with the at least any one of a clocking operation of the clocking means, a detection result of the voltage detecting means, and a detection result of the power storage amount detecting means.

8. The thermal power generation portable device according to claim 7, wherein the at least any one of the clocking means, the voltage detecting means, the power storage means, and the power storage amount detecting means comprises the clocking means; wherein the clocking means comprises hand drive means for driving at least one of a second hand indicating seconds of time, a minute hand indicating minutes of time, and an hour hand indicating hours of time; and wherein the member drive means automatically drives the movable member according to a clocking operation of the clocking means in an interlocking manner with at least any one of the second hand, the minute hand, and the hour hand.

9. The thermal power generation portable device according to claim 6, wherein the thermal resistance changing means comprises a manual operation member configured for manually operating the movable member.

10. The thermal power generation portable device according to claim 9, wherein the thermal resistance changing means changes the thermal resistance of at least any one out of between the living body and the thermal power generating member in the heat transfer path and between the heat release destination and the thermal power generating member in the heat transfer path.

11. The thermal power generation portable device according to claim 10, wherein the thermal resistance changing means changes the thermal resistance between the living body and the thermal power generating member in the heat transfer path by changing the thermal resistance of a member that comes into contact with the living body.

12. The thermal power generation portable device according to claim 10, wherein the thermal resistance changing means changes the thermal resistance between the heat release destination and the thermal power generating member in the heat transfer path by changing the thermal resistance of a member that is provided between the heat release destination and the thermal power generating member in the heat transfer path and that comes into contact with the thermal power generating member.

13. The thermal power generation portable device according to claim 10, wherein the thermal resistance changing means changes the thermal resistance between the heat release destination and the thermal power generating member in the heat transfer path by changing the thermal resistance of a heat release region between a housing provided between the heat release destination and the thermal power generating member in the heat transfer path.

14. A power generation control method comprising:
a first step of providing a thermal power generation portable device configured to be mounted to a living body and capable of generating power with the heat of the living body, the thermal power generation portable device comprising:
a thermal power generating member that generates power on the basis of a temperature difference between a temperature at a heat-source-side position and a temperature at a heat release destination-side position between the living body that is a heat source and a heat release destination of heat released from the thermal power generation portable device;
thermal resistance changing means for changing the thermal resistance of at least a portion of a heat transfer path between the living body and the heat release destination; and
a second step of changing the thermal resistance of at least a portion of the heat transfer path during generation of power by the thermal power generating member; and
a third step of changing, after the changing of the thermal resistance in the second step, the thermal resistance of at least a portion of the heat transfer path toward a value before changing of the thermal resistance in the second step.

15. A portable thermal power generation device for generating power using heat produced by a living body, the portable thermal power generation device comprising:
a thermal power generation member that generates power on the basis of a temperature difference between a temperature at a heat source-side position and a temperature at a heat release destination-side position between the living body that is a heat source and a heat release destination of heat released from the portable thermal power generation device; and
a movable member configured to change a thermal resistance of at least part of a heat transfer path between the living body and the heat release destination.

16. The portable thermal power generation device according to claim 15, wherein the movable member is mounted to undergo rotation about a rotating shaft or to undergo sliding movement in a predetermined direction; and wherein the movable member is configured to change the thermal resistance of the at least part of the heat transfer path by the presence or absence of interference with the heat transfer path or the change of the position of the interference with the heat transfer path in accordance with rotation or sliding movement of the movable member.

17. The portable thermal power generation device according to claim 15, wherein the movable member comprises a plate-shaped member configured to intersect the heat transfer path.

18. The portable thermal power generation device according to claim 15, wherein the movable member is mounted to undergo rotation around the rotational shaft and has a shape that is point-symmetrical with respect to an axial center of the rotational shaft.

19. The thermal power generation portable device according to claim 15, wherein the movable member is mounted to undergo rotation around the rotational shaft and has a shape that is non-point-symmetrical with respect to an axial center of the rotational shaft.

20. The portable thermal power generation device according to claim 15, wherein the movable member is configured to switch a state in which the thermal resistance of at least a portion of the heat transfer path becomes a first thermal resistance and a state in which the thermal resistance of at least a portion of the heat transfer path becomes a second thermal resistance different from the first thermal resistance.

\* \* \* \* \*